(12) United States Patent
Shields et al.

(10) Patent No.: US 7,132,676 B2
(45) Date of Patent: Nov. 7, 2006

(54) PHOTON SOURCE AND A METHOD OF OPERATING A PHOTON SOURCE

(75) Inventors: Andrew James Shields, Cambridge (GB); Richard Mark Stevenson, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 407 days.

(21) Appl. No.: 10/145,140

(22) Filed: May 15, 2002

(65) Prior Publication Data

US 2002/0196827 A1 Dec. 26, 2002

(30) Foreign Application Priority Data

May 15, 2001 (GB) ................. 0111870.2
Mar. 11, 2002 (GB) ................. 0205670.3

(51) Int. Cl.
*H01L 29/06* (2006.01)
(52) U.S. Cl. ................. 257/14; 257/14; 257/98
(58) Field of Classification Search .......... 257/14, 257/20, 196, 200, 201
See application file for complete search history.

(56) References Cited

U.S. PATENT DOCUMENTS 5,959,307 A * 9/1999 Nakamura et al. .......... 257/14

FOREIGN PATENT DOCUMENTS

| GB | 2 354 368 | 3/2001 |
| GB | 2 362 261 | 11/2001 |
| GB | 2 367 690 | 4/2002 |
| WO | WO 02/056238 | 7/2002 |

OTHER PUBLICATIONS

V. Zwiller, et al., Applied Physics Letters, vol. 78, No. 17, pp. 2476-2478, "Single Quantum Dots Emit Single Photons at a Time: Antibunching Experiments", Apr. 23, 2001.
O. Benson, et al., Physical Review Letters, vol. 84, No. 11, pp. 2513-2516, "Regulated and Entangled Photons From a Single Quantum Dot", 2000 (to be filed later).
G. Bacher, et al., Physical Review Letters, vol. 83, No. 21, pp. 4417-4420, "Biexciton Versus Exciton Lifetime in a Single Semiconductor Quantum Dot", Nov. 22, 1999.
P. Michler, et al., Science, vol. 290, pp. 2282-2284, "A Quantum Dot Single-Photon Turnstile Device", Dec. 22, 2000.
C. Santori, et al., Physical Review Letters, vol. 86, No. 8, pp. 1502-1505, "Triggered Single Photons From a Quantum Dot", Feb. 19, 2001.

(Continued)

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

A photon source comprising a quantum dot comprising a confined conduction band energy level capable of being populated with at least one carrier and a confined valence band energy level capable of being populated by at least one carrier is provided, the source further comprises supply means for intermittently supplying at least one carrier to the energy levels to create an exciton in the quantum dot, wherein the supply means are configured to regulate the supply of carriers such that as the exciton decays either a single photon or a plurality of single photons each having different distinct energies are emitted during a predetermined time interval. The source is configured to be able to enhance the production of a desired type of exciton and can also be configured to exploit the use of higher order excitons such as biexcitons.

33 Claims, 31 Drawing Sheets

OTHER PUBLICATIONS

R. J. Warburton, et al., Nature, vol. 405, pp. 926-929, "Optical Emission From a Charge-Tunable Quantum Ring", Jun. 22, 2000.

F. Findeis, et al., Physical Review B, vol. 63, No. 12, pp. 121309-1 - 121309-4, "Optical Excitations of a Self-Assembled Artificial Ion", 2001.

J. J. Finley, et al., Physical Review B, vol. 63, No. 7, pp. 073307-1 -073307-4, "Charged and Neutral Exciton Complexes in Individual Self-Assembled In(Ga)As Quantum Dots", 2001.

A. Hartmann, et al., Physical Review Letters, vol. 84, No. 24, pp. 5648-5651, "Few-Particle Effects in Semiconductor Quantum Dots: Observation of Multicharged Excitons", Jun. 12, 2000.

C. H. Bennett, et al., Proceedings of the IEEE International Conference on Computers, Systems, and Signal Processing, pp. 175-179, "Quantum Cryptography: Public Key Distribution and Coin Tossing", Dec. 10-12, 1984.

C. H. Bennett, Physical Review Letters, vol. 68, No. 21, pp. 3121-3124,, "Quantum Cryptography Using Any Two Nonorthogonal States", May 25, 1992.

S. N. Molotkov, arXiv.quant-ph/9811038, pp. 1-9, "Quantum Cryptography Based on Photon "Frequency" States: Example of a Possible Realization", Nov. 16, 1998 (complete copy to be filed later).

W. Tittel, et al., Physical Review Letters, vol. 84, No. 20, pp. 4737-4740, "Quantum Cryptography Using Entangled Photons in Energy-Time Bell States", May 15, 2000.

I. Robert, et al., Physica E, vol. 13, pp. 606-609, "Tailoring Photon Emission Statistics of a Single Quantum Box for Quantum Communications", 2002.

S.N. Molotkov; "Quantum Cryptography Based on Photon "Frequency" States: Example of a Possible Realization", Institute of Solid-State Physics, Russian Academy of Sciences, 142432 Chernogolovka, Moscow District, pp. 1-11.

Oliver Benson; "Regulated and Entangled Photons From a Single Quantum Dot"; *Quantum Entanglement Project*, ICORP, JST, E.L. Ginzton Laboratory, Stanford University, Stanford, CA 94305, pp. 2513-2516.

* cited by examiner

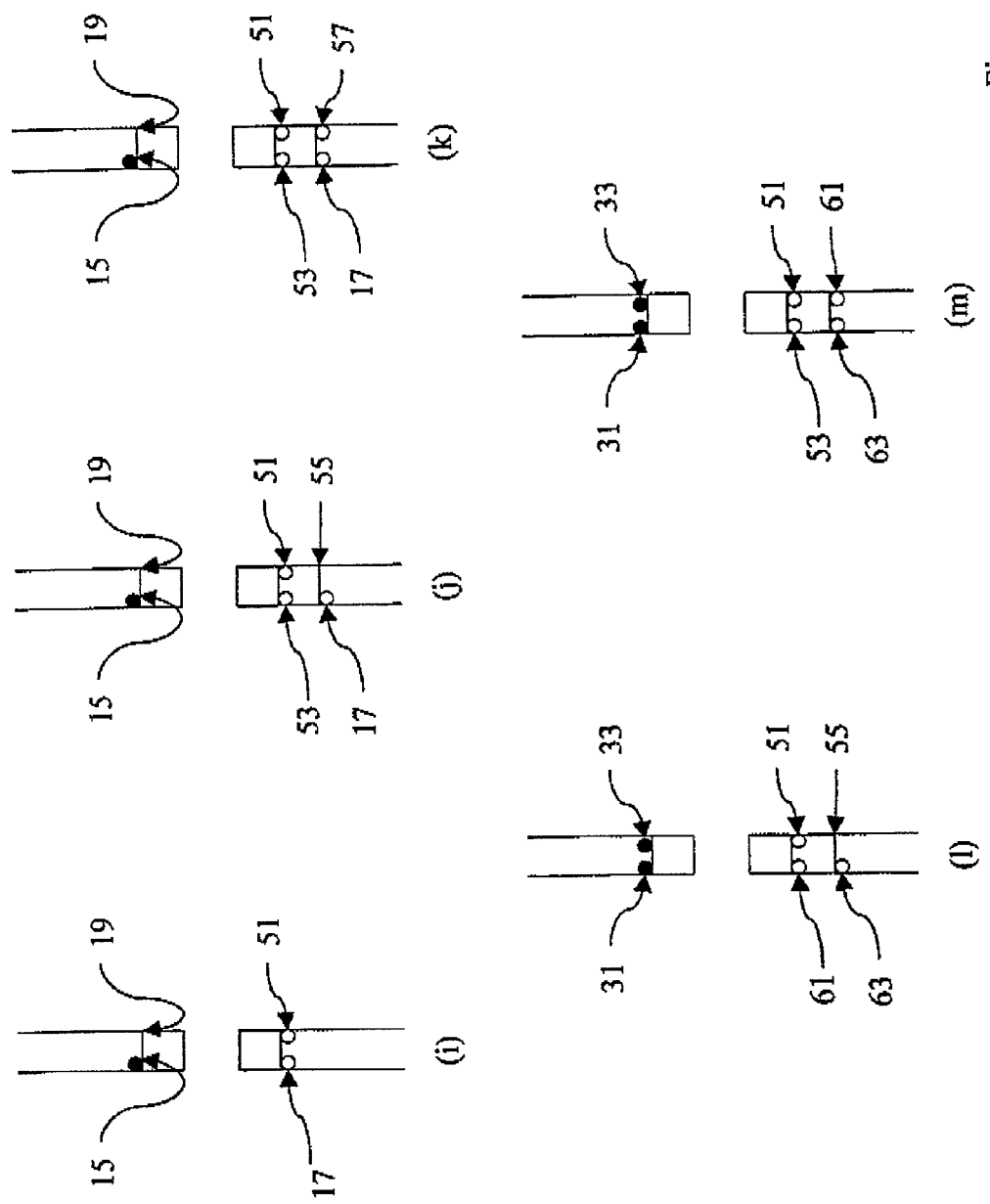

PHOTON SOURCE AND A METHOD OF OPERATING A PHOTON SOURCE

FIELD OF THE INVENTION

The present invention relates to a photon source which is capable of emitting single photons which are spaced apart by a predetermined time interval or pulses of n photons, where n is an integer which can be controlled to the accuracy of a single photon. More specifically, the present invention relates to such a source with enhanced control over the jitter time of the emitted photons.

BACKGROUND OF THE INVENTION

There is a need for so-called "single photon sources" for use in optical quantum cryptography where, for example, the security key for an encryption algorithm is formed by sending a stream of single photons which are regularly spaced in time. It is essential for the security of this technique that each bit is encoded on just a single photon. This is because an eavesdropper trying to intercept the communication will be forced to measure and thereby alter the state of some photons. Therefore, the sender and the intended recipient can determine if their communication has been intercepted.

Such a source is also useful as a low-noise source for optical imaging, spectroscopy, laser ranging and metrology. Normal light sources suffer from random fluctuations in the photon emission rate at low intensities due to shot noise. This noise limits the sensitivity of many optical techniques where single photons are detected. A single photon source which produces photons at regular time intervals has a reduced shot noise.

Recently, advances have been made in making such single photon sources from semiconductor quantum dot structures. Michler et al in "A Quantum Dot Single-Photon Turnstile Device" Science 290 p 2282 to 2284 (2000) and Santori et al "Triggered Single Photons from a Quantum Dot" Physics Review Letters 86 p 1502 to 1505 (2001) also describe single photon sources which operate by optically pumping a single quantum dot.

The above devices all concentrate on the production of a photon from the decay of a single neutral exciton (simple exciton) where prior to emission of the single photon there is a single electron in the ground state of the conduction band of the quantum dot and a single hole in the valence band of the quantum dot.

However, photons can also arise from the decay of more exotic excitons such as charged excitons or higher order excitons such as bi-excitons, triexcitons, quad excitons etc. Warburton et al, Nature 405 p926 to 929 describes photons arising from neutral and single, double, triple, quadruple and quintuple negatively charged single excitons in a quantum ring.

Findeis et al, Phys Rev B 63 p 121309-1 to 121309-4 (2001) and Finley et al, Phys Rev B 63 073307-1 to 073307-4 (2001) report observations of charged excitons from quantum dots.

Finally, Hartmann et al, Phys Rev Lett 84 p 5648 to 5651 describes experiments where they observe the presence of bi-excitons and higher order excitons in quantum dots.

In every single photon source where a photon is emitted due to recombination of an electron and a hole, there is always some uncertainty in the actual time when the photon will be emitted. This is usually referred to as the "jitter". The applicants have surprisingly found that by using photons resulting from the decay of higher order excitons or charged excitons, the jitter of the photon source can be reduced.

SUMMARY OF THE INVENTION

Thus, in a first aspect, the present invention provides a photon source comprising a quantum dot comprising a confined conduction band energy level capable of being populated with at least one carrier and a confined valence band energy level capable of being populated by at least one carrier; fixing means configured to fix the number of excess carriers in the energy levels by fixing the relative position of the energy levels with respect to the Fermi level of the source; and supply means for intermittently supplying at least one carrier to the energy levels to create an exciton in the quantum dot, wherein the supply means are configured to regulate the supply of carriers such that as the exciton decays either a single photon or a plurality of single photons each having different distinct energies are emitted during a predetermined time interval.

For the avoidance of doubt and as used hereinafter, the term 'exciton' is used to describe any combination of electrons and holes in the dot, and the term 'simple exciton' is used to describe the state of just one electron and just one hole. Further, the term 'excess carriers' is used to refer to the number of the more populous carrier (which may be either electrons or holes) minus the number of the other type of carrier.

The present invention is capable of being configured to produce a single photon or a group of n photons at a predetermined time. It may also be configured to repetitively produce single photons or groups of n photons at a predetermined time or times. The time between successive photon emissions can be controlled, successive photon emissions (be it single photons or n photons) will preferably be regularly spaced in time. Although, the source may be configured to irregularly space successive photon emissions.

The supply means may comprise a trigger means in order to trigger the supply of carriers at the required time or for the required time interval. The supply means will generally be a pulsed supply means delivering a supply of carriers per pulse such that an exciton is created in the quantum dot per pulse.

Charged excitons are produced when there is an excess of electrons or holes in the quantum dot prior to recombination. The ability to vary the conduction and valence band edges with respect to the Fermi level allows the actual number of excess electrons or holes in the quantum dot to be fixed. Thus, the source can be configured to produce photons from neutral, singly charged, doubly charged etc excitons as required. Without a means to fix the excess carrier density, it is likely that a photon source may produce a random mixture of charged and neutral excitons.

Also, an advantage in fixing the number of excess carriers in the dot is that it increases the emission efficiency of the source by concentrating more of the emission into a particular exciton line. As each of the different types of charged excitons has a different emission energy, by choosing a different exciton emission, the emission wavelength of the source is altered.

The fixing means may be configured to fix a finite number of excess carriers in the quantum dot or even to ensure that there are usually no excess carriers in the dot. When there are no excess carriers in the quantum dot, the probability of producing neutral excitons substantially increases. In this case, the Fermi Energy lies in the energy gap between the valence and conduction bands of the dot. Excess charges may be removed using a electric field provided across the quantum dot.

If the fixing means is configured to ensure that there is a single electron in the conduction band of the quantum dot, then the probability of forming excitons having a single negative charge is greatly increased. Such excitons may be single excitons, bi-excitons, tri-excitons etc. Similarly, the fixing means may be configured to fix the number of excess carriers in the valence band of the quantum dot so that the valence band of the quantum dot comprises one hole prior to introduction of carriers by the supply means. This will enhance the probability of creating excitons having a single positive excess charge. By increasing the number of excess carriers further than one, then the probability of creating excitons having a double, triple charges etc is enhanced.

The fixing means preferably comprises at least one electrode configured to apply an electric field across the quantum dot. This electrode may be provided in the form of a Schottky gate. At least one layer of the photon source may comprise a doped layer so that the potential applied to the Schottky gate can be applied with respect to the dot layer of the photon source. Alternatively, a potential can be applied between highly doped layers on either side of the dot. Also, it is possible to provide ohmic contacts to the device to provide a DC bias across the source in order to vary the energies of the conduction and valence bands with respect to the Fermi level. The dot may even be placed between two electrodes of opposing polarities i.e. a p-type layer and an n-type layer.

The supply means may preferably be configured to enhance the creation of bi-excitons and higher order excitons. If the supply means uses irradiation in order to excite electron hole pairs to create excitons in the quantum dot, then the power of the laser may be increased to intermittently excite more than one electron hole pair. Typically this can be achieved if the laser intermittently supplies at least two photons to the dot during any predetermined time interval.

When higher order excitons are excited, at least two photons will be emitted for each pulse supplied from the supply means. These photons will have different energies. Therefore, preferably, the photon source comprises a blocking means to block photons arising from emissions which are undesirable or not of interest. The blocking means allows the transmission of the desired photons to a receiver or to intermediate processing equipment which is placed between the photon source and a receiver. For example, the intermediate equipment may introduce changes in the polarisation or phase of the photons. The photons which are blocked may be annihilated or may be directed away from the desirable photons.

The blocking means may be provided at or adjacent to the quantum dot. The blocking means may also be provided remote from the quantum dot. For example, the blocking means may be provided at a detector or receiver for the photons leaving the dot.

For example, the photon source may form part of a photon transmission apparatus which also comprises a receiver, where the blocking means is located at the receiver.

The blocking means may be a filter configured to block photons of a certain undesirable energy or energies. The filter may be tuneable in wavelength.

The filter may be an interference filter comprising alternating dielectric layers, or a prism or a grating spectrometer, or a fibre optic filter. The filter may be integrated within the photon source itself or it may be provided on the photon source. For example, the filter may be provided by a resonant cavity in which the quantum dot is disposed.

The dimensions of the cavity may be chosen such that emission at the desired photon emission energy is enhanced.

As an alternative to wavelength filtering, it is also possible to distinguish between the emission from some excitons using time. A single exciton will be emitted after a bi-exciton or higher order exciton, thus either the single exciton or higher order exciton emission can be blocked by blocking the output of the source at certain times. For example, if bi-exciton emissions are of interest, then a blocking means may be provided which is configured to block emission from the source except at the times when there is a high probability of a bi-exciton emission. The blocking means may comprise means to time-gate a receiver.

The emission time can also be used to distinguish between charged and neutral excitons as they will have different emission times.

When a bi-exciton is formed, a first photon is emitted due to the decay of the bi-exciton. A second photon is then emitted when the single exciton decays. The blocking means may be configured to block such lower order emissions such as the single exciton decay.

The blocking means may also be configured to block the single neutral exciton emission.

Also, as charged excitons may be advantageous due to their quicker decay time than that of the neutral excitons, the blocking means may be configured to block out photons at any neutral exciton frequency.

Although, the present invention can be used to essentially choose between the formation of charged excitons or neutral excitons, it should be noted that even when charged excitons are chosen, there is a chance that some neutral excitons (albeit a small number) may be produced. For a single photon source, all excitons of the same order may be collected together e.g. single excitons, i.e. charged and neutral may be collected together or biexcitons both charged and neutral may be collected together as the dot cannot produce a neutral exciton and a charged exciton of the same order. The blocking means may be provided to transmit excitons of a predetermined order regardless of whether they are charged or not.

Although it is highly desirable to have a device where you can choose between what order of exciton e.g. single exciton, biexciton, triexciton etc and the charge state of that exciton, a photon source which allows the higher exciton states to be utilised, still provides considerable advantages over the previous devices where only the single neutral exciton decay has been utilised.

Therefore, in a second aspect, the present invention provides a photon source comprising a quantum dot comprising a confined conduction band energy level capable of being populated with at least one carrier and a confined valence band energy level capable of being populated by at least one carrier; supply means for intermittently supplying at least one carrier to the energy levels to create an exciton in the quantum dot, wherein the supply means are configured to regulate the supply of carriers such that as the exciton decays either a single photon or a plurality of single photons each having different distinct energies are emitted during a predetermined time interval; and blocking means configured to block photons at the neutral single exciton frequency.

The blocking means may also be located in a receiver, thus, in a third aspect, the present invention provides a photon transmission apparatus comprising: a photon source comprising: a quantum dot comprising a confined conduction band energy level capable of being populated with at least one carrier and a confined valence band energy level capable of being populated by at least one carrier; and supply means for intermittently supplying at least one carrier to the energy levels to create an exciton in the quantum dot, wherein the supply means are configured to regulate the supply of carriers such that as the exciton decays either a single photon or a plurality of single photons each having different distinct energies are emitted during a predetermined time interval; a receiver for receiving photons emitted by the source; and blocking means configured to block photons arising from the neutral single exciton emission.

The blocking means can be of the type previously described. For example, the supply means may preferably excite a bi-exciton As previously mentioned, when higher order excitons are generated, there will be at least two photons emitted. In the situation where a bi-exciton is excited, a first photon is emitted due to the decay of the bi-exciton to a single exciton and then a second photon is emitted due to the decay of the single exciton itself. If the dot is anti-symmetric, the first and second photons will have the same polarisation states. Thus, the polarisation of one of the photons can be measured to determine the polarisation of both of the photons.

Therefore, in a fourth aspect, the present invention provides a photon source comprising a quantum dot comprising a confined conduction band energy level capable of being populated with at least one carrier and a confined valence band energy level capable of being populated by at least one carrier; supply means for intermittently supplying carriers to the energy levels to create a bi-exciton or higher order exciton in the quantum dot, wherein the supply means are configured to regulate the supply of carriers such that as the exciton decays a plurality of single photons each having different distinct energies are emitted during a predetermined time interval; and means to separate the photons having different distinct energies.

The means to separate the photons having different distinct energies allows one photon to be sent to a first receiver and the other photon to be sent to a second receiver. This is not only limited to bi-excitons, the principle can be extrapolated to photons arising from the decay of triexcitons or higher order excitons where again, means can be provided to separate at two or more of the photons having different distinct energies.

It has also be found that for anti-symmetrically shaped quantum dots, the emitted photons are linearly polarised. The time averaged emission has been determined to consist of approximately equal amounts of photons linearly polarised in one of two orthogonal directions. Two other important features of the polarisation of the emitted photons are as follows. Firstly, pairs of photons emitted by the radiative decay of the biexciton down to the ground state were found to have the same linear polarisation. This leads to possibility of determining the polarisation of one photon in the pair by measuring the polarisation of the other photon. The second feature is that the orientation of the polarisation was randomly selected for each pair of photons emitted from the decay of biexcitons at different times.

Thus, photon pairs are emitted with identical linear polarisation, and the orientation of the polarisation randomly changes from pair to pair, and is always in one of two orthogonal directions. Other multiple photon decays of other multi-exciton states are also believed to produce groups of photons with fixed relationships in the polarisation of some or all of the photons within the group, and that the relationship of the polarisation of one group of photons may be random with respect to subsequent groups of photons emitted after re-excitation.

Thus, using the above photon source, a sender may measure the polarisation of one photon in a polarisation-correlated pair, to non-destructively determine the polarisation of the other photon. The polarisation of the transmitted photon needs to be known for some quantum key distribution protocols.

Also, the previously described photon source has an inherent randomness in the polarisation state of the emitted photons which may be used to randomly encode quantum parameters onto the photons emitted from such a source.

Thus, the photon source may further comprises encoding means to vary at least one of the quantum states of the photons having the first polarisation state and/or the photons having the second polarisation state. The quantum states of the photons being polarisation, phase or energy/time.

Considering using just polarisation, the source may be used to encode photons in accordance with the BB84 protocol. This is described in Bennett et al. Proceedings of the IEEE International Conference on Computers, Systems and Signal Processing, Bangalore, India (IEEE, New York 1984) p 175.

In summary, in the BB84 protocol, the photon source needs to emit a stream of photons having a polarisation state which occupies one of two non-orthogonal polarisation basis. The above photon source inherently outputs photons which either have a first polarisation state or a second polarisation state, the first polarisation state being orthogonal to the second polarisation state. Thus, it outputs photons which have a polarisation state in the same basis where the polarisation randomly switches between two polarisation states in that basis.

However, the source does not inherently output a stream of photons where the polarisation basis also changes between two non-orthogonal basis. To achieve such a photon source, the encoding means preferably comprises means to selectively rotate the polarisation of the outputted photons by either n degrees or m degrees where n and m are not equal and have a difference which is not an integer multiple of 90°. Topically, n will equal 0 and m will equal 45°.

The B92 protocol is also used for quantum communication. In the B92 protocol which is described in Bennett, Phys Rev. Lett, 68 3121 (1992).

In the B92 protocol, a steam of photons are emitted having one of two quantum states. The two quantum states must be non-orthogonal. As the above photon source outputs photons having one or two potential orthogonal states, the source can be modified to a B92 source by rotating the polarisation of all the photons having the first polarisation state by n degrees and all the photons having the second polarisation state by m degrees. n and m are integers which are not equal and which have a difference which is not an integer multiple of 90°. Typically, n will equal 0° and m will equal 45°.

Also, it is possible to make a BB84 source where the random switching between polarisation basis of sequential photons is controlled by the original distribution of polarisation states between sequential photons. This may be achieved by first rotating the polarisation state of photons having the first polarisation state by n degrees and by rotating the polarisation state of photons having the second polarisation state by m degrees where n and m are not equal and have a difference which is not an integer multiple of 90° such that the first polarisation state and the second polarisation state are now non-orthogonal. The photons may then be combined and then the polarisation of the photons may again be randomly rotated by either r degrees or t degrees where the difference between r and t is an integer multiple of 90°. Thus, changing the polarisation state of some of the photons within the same basis.

When using quantum communication, the photon is encoded by varying at least one of the quantum states of the photon, and the quantum parameters are generally believed to be polarisation, phase and energy/time as described by S. N. Molotkov, arXiv. quant-ph/9811038 (1998) and Tittel et al, Phys. Rev. Letters 84, 4737 (2000).

Although the photons emitted due to exciton decay have one of two orthogonal polarisation states, this random variation in the polarisation can also be used to control a random variation in the phase or other quantum parameters of the photons.

This may be achieved if the encoding means further comprises means for setting a first phase state of the photons which have the first polarisation and a second phase state of the photons which have the second polarisation, the first and second phase states being non-orthogonal. This allows phase to be used in accordance with the B92 and other protocols.

However, it will be appreciated that once the phase has been set according to the polarisation, phase could be used in accordance with any of the above described protocols.

As previously mentioned, the photons which arise due to the decay of a biexciton have the same polarisation state. Thus, if the separating means are provided before the encoding means, then the source knows the polarisation state of the photon before it enters the encoding means and can thus derive the polarisation or phase state of the photon when it exits the encoding means. In some protocols, some features of the encoding means are randomly controlled. However, this can be done via an external random number generator whereby a user of the source would know the random polarisation or phase change added to a particular photon by such a means.

There is no means of controlling or influencing the polarisation state of the photons which are emitted due to exciton decay. Thus, a source is provided which is very difficult to hack or externally influence.

In some cases, it will be necessary for the source to know what is the polarisation state of the outputted photons. Thus, the separating means may be provided before the encoding means and the separating means may be configured to direct photons having one of the said different distinct energies into a means for measuring this polarisation state. Alternatively, two photons arising from a single bi-exciton decay may pass through the encoding means, the encoding means being set to encode both photons identically, then one of the photons may be measured on exiting the encoding means, providing that sufficient knowledge about the final state of the photon, i.e. the basis of its polarisation, is also known.

The above photon source also provides a basis for a quantum communication system which comprises a photon source as described above and first and second detectors, each of the photon detectors having a classical communication channel to the photon source to allow exchange of classical information in accordance with the BB84 or B92 protocols.

Thus, in a fifth aspect, the present invention provides a quantum communication method, comprising outputting from a photon source a sequence of photons, said photons being output in groups of m photons, where m is an integer of at least two, wherein at least one measurable quantum state randomly switches between at least two non-orthogonal basis for each group of m photons, the said at least one quantum state remaining fixed for all photons within the same group; separating the photons within the same group and that one photon is sent to a first detector and a second photon is sent to a second detector; receiving information over a classical channel from said first detector concerning the measurement basis used by said first receiver; receiving information over a classical channel from said second detector concerning the measurement basis used by said second receiver; and informing over a classical link, both the first and second detector which results to retain, the source instructing the detectors to retain results from measurements which both detectors made using the same basis as the sent photon.

The means to separate the photons may comprise means to separate the photons by using time or energy.

The supply means in any of the above sources may be radiation which is configured to excite one or a predetermined number of electrons and holes within the first and second energy levels respectively.

The fixing means of the type described in relation to the first aspect of the invention.

As previously mentioned, there may be many conduction band levels into which electrons can be excited, similarly, there may be many valence band levels. If an electron is supplied to an excited energy level of the conduction band then the electron will almost certainly relax into a lower energy state or the ground state of the conduction band prior to recombining with a hole. The time which a carrier spends in a energy state before relaxing to a lower energy state is known as the 'relaxation time'. As used hereinafter, the relaxation time will be taken to mean the average time which a carrier remains in an energy state before releasing to another energy level. As used hereinafter, the recombination time will be taken to mean the average time it takes for an electron and hole to recombine. Usually caners will undergo relaxation more quickly than recombination. This is especially true when the carriers are created in the excited levels of the quantum dot, as in this case, the carriers usually relax to the ground states of the quantum dot before recombination. However, in some situations, relaxation may occur by recombination.

An electron from the ground state may recombine with a hole to emit a photon. Alternatively, an electron from an excited state may recombine with a hole to emit a photon. It should be noted that although it is possible that an electron from a higher energy state to combine with a hole, the probability of this transition occurring is very small, as it is far more likely that the electron will first relax into the ground state prior to recombination.

When forming charged excitons, the conduction or valence bands may already be populated with electrons or holes respectively. In this situation, it is necessary to excite the photo-excited carriers with enough energy to populate the excited energy levels as the lower energy levels may be occupied by excess carriers. It should be noted that the photo-excited carriers can only relax if there is a free lower energy state available in the same band.

To excite the carriers into the conduction and valence bands for recombination, the source is illuminated with radiation which is configured to excite one or more electron-hole pairs in the ground or excited states of the quantum dot, or in the surrounding barrier material.

This is achieved by irradiating the quantum dot with radiation having an energy equal to or higher than that of the appropriate optical transition energy of the quantum dot or its surrounding material. The required transition energy may be capable of exciting an electron into the ground state of the conduction band and a hole into the ground state of the valence band of the quantum dot. Alteratively, it may be required to supply the electron and/or hole into one of the excited energy levels of the quantum dot. In the quantum dot, the confined conduction band (valence band) levels can only accommodate a maximum of two carriers. One of these carriers is of a spin up and the other electron is of a spin down configuration.

The radiation may also excite one or more electron-hole pairs in the surrounding material, after which they will quickly relax into the quantum dot before recombination.

It is possible to configure the structure so that only one electron is excited into a level of the quantum dot by each pulse of the radiation. This can be done by either polarising the incident light so that it circularly polarised with a single orientation direction (e.g. either left or right circular polarisation). Or, a magnetic field can be applied to the device to lift the spin degeneracy of the conduction band level. Only one electron can then be accommodated in a single conduction band level.

Also, the absorption of the of electron hole pair by the dot results in a shift in the transition energy of the dot. The spectral line width of the laser can be tuned to be smaller than this shift in energy. Thus, it is possible to excite one single electron hole pair at a time.

For the purpose of explaining the operation of the device, it will be assumed that there is only one electron in the conduction band of the quantum dot. A hole will also be excited into the valence band layer when the electron is supplied to the conduction band layer.

The electron and the hole will recombine to emit a photon during a characteristic time called the recombination time. If the incident radiation has an energy equal to that of the lowest energy transition energy of the quantum dot and the radiation is pulsed with a duration much shorter than the recombination time, then by the time the electron and hole have recombined, no radiation is present to excite a second electron and hole. Therefore, only a single photon is emitted.

Also, the time between the leading edges of the incident pulses should be longer than the recombination time. This is to prevent a second pulse arriving at he quantum dot before a photon from the desired excitonic emission has been emitted.

If the radiation photon energy is tuned to the energy of an excited (i.e. not lowest energy) transition of the quantum dot, the photoexcited electron and hole will relax to their ground energy levels in the dot before recombination. If the duration of the pulse is much shorter than the relaxation time, then only a single electron and hole can be excited per pulse of the exciting radiation. Therefore, only a single photon is emitted.

However, if the pulse duration is longer than the relaxation time, a second electron hole pair might be excited after relaxation of the first electron hole pair forming a bi-exciton. However, the bi-exciton decay will emit a photon having a different energy to that of the single exciton decay. Thus, the two photons may be distinguished as they have different emission energies and times.

If the conduction band contains two electrons which recombine with two holes, the two photons emitted will have the same polarisations, different photon energies and be emitted sequentially. Therefore, a filter selecting a particular photon energy, or emission time will allow a regular stream of single photons to be produced. For the multi-photon decay of some higher order excitons, the photons may have different polarisations. In this case, polarisation can be used to select a single photon.

The detection of the single photons may also be gated in time so as to detect just one of the emitted photons in average.

Also, if the degeneracy of the levels is lifted by a magnetic field, the emitted photons will have different energies depending on the specific transition. Hence, it is possible to filter out photons emitted at the other energies to obtain a stream of single photons.

In order to excite a particular transition in the dot, i.e. in order to populate a certain conduction band level (i.e. the ground state or an excited level), the dot is irradiated with radiation having an energy substantially equal to that of the required energy level.

Often it is convenient to prepare a device with more than one quantum dot. Often these quantum dots possess different transition energies due to fluctuations in their size or composition. In this case, the emission from a single quantum dot may be isolated by filtering the wavelengths of the emitted light. By allowing only the light in a narrow bandpass to pass it is possible to collect the emission of a single dot and exclude that of the others.

Preferably, the area of the source from which light is collected contains at most one thousand optically active quantum dots.

Alternatively, it is possible to selectively excite a single quantum dot by using a laser with a narrow wavelength spectrum. The laser will excite only the quantum dot with the appropriate transition energy.

It is also possible to produce an n-photon source if a dot is produced which has transition energies which lie close enough to one another such that it is possible to excite more than one transition at a time. Another possible way to produce an n-photon source is to use several excitation wavelengths in the incident pulse.

In these devices with more than one quantum dot, it is possible to change the quantum dot from which light is collected by changing the wavelength bandpass energy or the laser energy.

The selected population of an electron or hole level can also be achieved using continuous radiation (i.e. non-pulsed). If the photon source is irradiated with radiation corresponding to a particular transition energy within the quantum dot, the population of the quantum dot levels can be controlled by periodically varying the transition energy of the quantum dot. This can be done in many ways, for example, the electric field across the dot may be varied by an applied AC voltage. Also, the carrier density of the dot or surrounding layers, the magnetic field applied to the quantum dot and even the temperature of the quantum dot can all be modulated to vary the transition energy of the quantum dot.

Where the photon source is modulated in order to inject carriers or vary the transition energy of the dot, the fixing means can be realised by modulating the potential so that excess carriers or no excess carriers are provided in the dot when the transition energy of the dot is equal to or less than the laser energy.

The transition energy of the quantum dot can be modulated so that the confined energy level is only capable of being populated by carriers for a certain time. This should be less than the recombination time of the photoexcited electron-hole pair. Therefore, although the radiation intensity is constant, light can only be absorbed by the quantum dot for the short time that the transition energy is equal to or less than that of the irradiating radiation. The electron and hole can then recombine to emit a photon in the same way as described with reference to excitation by the pulsed laser.

Sometime later, the transition energy of the quantum dot will be swept through the laser energy again and the dot is able to absorb an electron and hole again. Again, the degeneracy of the level may be lifted by application of a magnetic field or, a single electron may be introduced into the level by polarisation of the incident radiation. As before, the emitted radiation can be filtered to remove emitted light from the specific polarisation or to remove photons which arise due to recombination within other quantum dots.

Previously, the discussion has concentrated on illuminating the device in order to supply carriers for the conduction valence band. However, the present invention may also operate by populating either of the conduction or valence bands by injection of carriers into the conduction or valence band level. In such a structure, in order to obtain fine control, it is preferable if either the conduction band levels or the valence levels are continually populated with excess carriers. The remainder of the discussion will concern a device where the valence band levels are populated with excess holes and electrons are injected into the conduction band. However, it will be appreciated that the inverse device can be fabricated where the conduction band levels are populated with excess electrons, and holes are injected into the valence band. The fixing means may be provided to fix the excess carrier concentration.

The holes are preferably provided to the valence band of the quantum dot via a doped barrier. Such a doped barrier will preferably be a remotely doped or modulation doped barrier which is separated from the quantum dot by a spacer layer.

Preferably the quantum dots are placed within a two dimensional excess carrier gas so as to provide the excess carriers.

Preferably at least one ohmic contact is made to the two dimensional carrier gas so as to repopulate the carrier gas after recombination of an excess carrier with an injected carrier.

Electrons are injected into a conduction band level of the dot. As with the previously described optically excited sources, the injected electron and a hole recombine and emit a photon. To avoid more than one photon emission, the electrons are preferably injected one at a time. A particularly preferable way of injecting the electrons is to use resonant tunnelling through a barrier layer. Here, the energy of the injected electrons is matched to the energy of a conduction band level in the quantum dot. To achieve selected injection of electrons, the energy of the electrons to be injected is periodically varied so that the device is switched between an ON state (where the energy of the injected electrons aligns with that of the conduction band level within the quantum dot) and an OFF state (where the injected electrons do not align with the conduction bands within the quantum dot). In the OFF state, electrons cannot tunnel into the quantum dot.

The present invention may comprise a plurality of quantum dots. In such a device, it is virtually impossible to make a plurality of quantum dots which will have identical transition energies. Therefore, it is possible to select emission from a single quantum dot by filtering the wavelengths of the collected light. There is also a variation in the transition energy from dot to dot which may be due to fluctuations in the size or composition of the dots for instance. Thus, it is possible to selectively inject carriers into just one of the quantum dots.

In the above described device, this can be achieved by precise control of the voltage in the "ON" state. Alternatively, it may be possible to control the energy of the illuminating radiation to excite a transition in a single dot.

Preferably, the area of the source from which light is collected should contain, at most 1000 optically active quantum dots.

Once the photon is emitted from the quantum dot, it can be collected by an optical fibre. Preferably, the device is provided with a coupling means to allow the photons to be efficiently collected by a fibre optic cable. Such coupling means may comprise antireflection coating located on the surface of the device through which the emitted photons are collected. Also, the antireflection coating could be located on the optical fibre itself.

The coupling means may also comprise a lens to collect emitted photons.

A particularly preferable arrangement of the device is achieved if the source has a mirror cavity which has two mirrors located on opposing sides of the quantum dot. Preferably, one of the mirrors (ideally the mirror closest the output surface) is partially reflective such that it can transmit the emitted photons. More preferably, the energy of the cavity mode for said mirror cavity is preferably substantially equal to that of the emitted photons. Further, it is preferable if the distance between the two mirrors $L_{cav}$ of the cavity is defined by $$L_{cav} = \frac{m\lambda}{2n_{cav}}$$

where m is an integer, $n_{cav}$ is the average refractive index of the cavity and $\lambda$ the emission wavelength (in vacuum).

The advantage of using a cavity is that it allows more of the emitted light to be coupled into the numerical aperture of the collecting fibre or optic. The cavity mode of the resonant cavity is emitted into a narrow range of angles around the normal to the mirrors. The fibre/collection optic is arranged to collect the cavity mode.

The resonant wavelength of the cavity can be chosen to be that of the wavelength of the desired transition. Thus, the cavity may also act as a filter means.

At least one of the mirrors may be Bragg mirror comprising a plurality of alternating layers where each layer satisfies the relation:

$$n_a t_a = n_b t_b = \lambda/4$$

Where one dielectric layer (A) has a refractive index of $n_a$ and a thickness of $t_a$ and second dielectric layer (B) has a refractive index of $n_b$ and a thickness of $t_b$.

At least one of the mirrors may also comprise a metal layer. A phase matching layer should also be located between the cavity and the metal layer, so that an antinode is produced in the cavity mode at the interface between the cavity and phase matching layer. At least one of the mirrors may even be a semiconductor/air or semiconductor/dielectric interface.

A three dimensional cavity may also be provided by forming a photonic band gap structure within the plane of the layers of the two dimensional cavity.

In the device with multiple quantum dots, the cavity is preferably designed so that only one of the quantum dots has an emission energy which couples to the cavity mode. This can be used to ensure that emission from only one dot is collected producing just single photons. The energy of the cavity mode is controlled largely by the optical thickness of the cavity layer.

In this case, the energy width or band-pass of the cavity mode should be approximately equal to the line width of the emitting quantum dot. This can be achieved by configuring the design of the cavity as required—in particular the reflectivities of the cavity mirrors.

The width of the cavity mode decreases with increasing mirror reflectivity. The mirror reflectivities can be increased by increasing the number of periods in a Bragg mirror.

The device has been described with one optical fibre. However, it will be appreciated that the device can be fabricated with more than one quantum dot emitting into more than one fibre.

A particularly preferable method for fabricating the quantum dot(s) of the present invention is by use of a self-assembling growth technique (such as the Stranskii Krastinow growth mode).

Typically, the first material will be InAs, InGaAs or InAlAs and can be grown to a thickness of preferably less than 50 nm. The second material will preferably be GaAs or AlGaAs.

Preferably, a layer of a third material overlying the first material. The third material may be the same as the second material.

The areal density of the quantum dots is preferably less than $3 \times 10^7$ cm$^{-2}$.

Methods of operating the photon sources according to the first, second and fourth aspects of the invention are provided as fifth, sixth and seventh aspects of the invention.

BRIEF DESCRIPTION OF THE DRAWINGS

The present invention will now be described with reference to the following preferred, non-limiting embodiments in which.

DETAILED DESCRIPTION OF THE INVENTION

Figure 1:
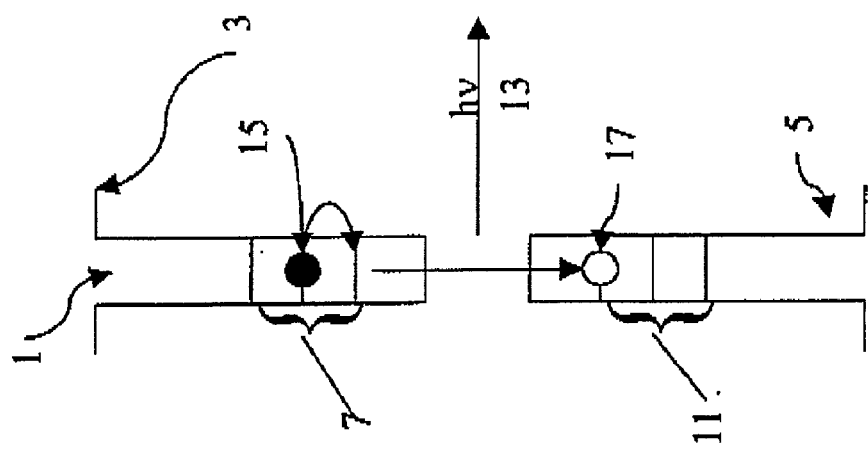
FIG. 1 shows a schematic band structure of a single quantum dot.

FIG. 1 shows a schematic band structure of a single quantum dot 1. The quantum dot forms a minimum in the conduction band 3 and a maximum in the valence band 5. A plurality of quantised conduction band levels 7 are formed in the minimum and a plurality of valence band levels 11 are formed in valence band maximum. Due to the Pauli exclusion principle each of these levels 7, 11 can accommodate two carriers corresponding to the two possible spin states.

Recombination of a single electron 15 and a single hole 17 within the dot results in the emission of a single photon 13. This recombination occurs over a characteristic time called the recombination time.

It is impossible using attenuation of a laser beam alone to obtain a stem of single photons regularly spaced in time or at predetermined times. However, in the quantum dot shown in FIG. 1, a photon is emitted only when an electron and hole recombine. Therefore, providing that a predetermined number of electrons and holes can be supplied to the dot 1 at regular time intervals and that the recombination time is shorter than the time between successive supply events, a stream of single photons can be produced.

Alternatively (or additionally), a single photon can be collected after each supply event by filtering the emission in photon energy or time to collect the emission from only one exciton in the dot.

If the electron and hole in the quantum dot are excited optically, then the level occupied by the electron and hole initially, is dependent on the wavelength (or energy) of the incident light. The electron and/or hole may be excited into the ground state levels from which they will recombine or they may be excited into excited levels. From such excited levels, the electron and hole will most probably relax into a lower energy level before recombination. The time which a carrier takes to transfer from an excited level to a lower level is known as the "relaxation time". Generally, it is more statistically favourable if the carrier relaxes from an excited state to the ground state conduction band before recombination.

The electrons and holes may also be excited in the surrounding material and then relax into the quantum dot. This relaxation process typically occurs much more rapidly than recombination of the electrons and holes.

FIGS. 2a to m illustrate some possible excitons which are formed when electrons and holes are excited into the conduction band 3 and valence band 5 of the dot. The relative separations between the energy levels are not to scale.

Figure 2:
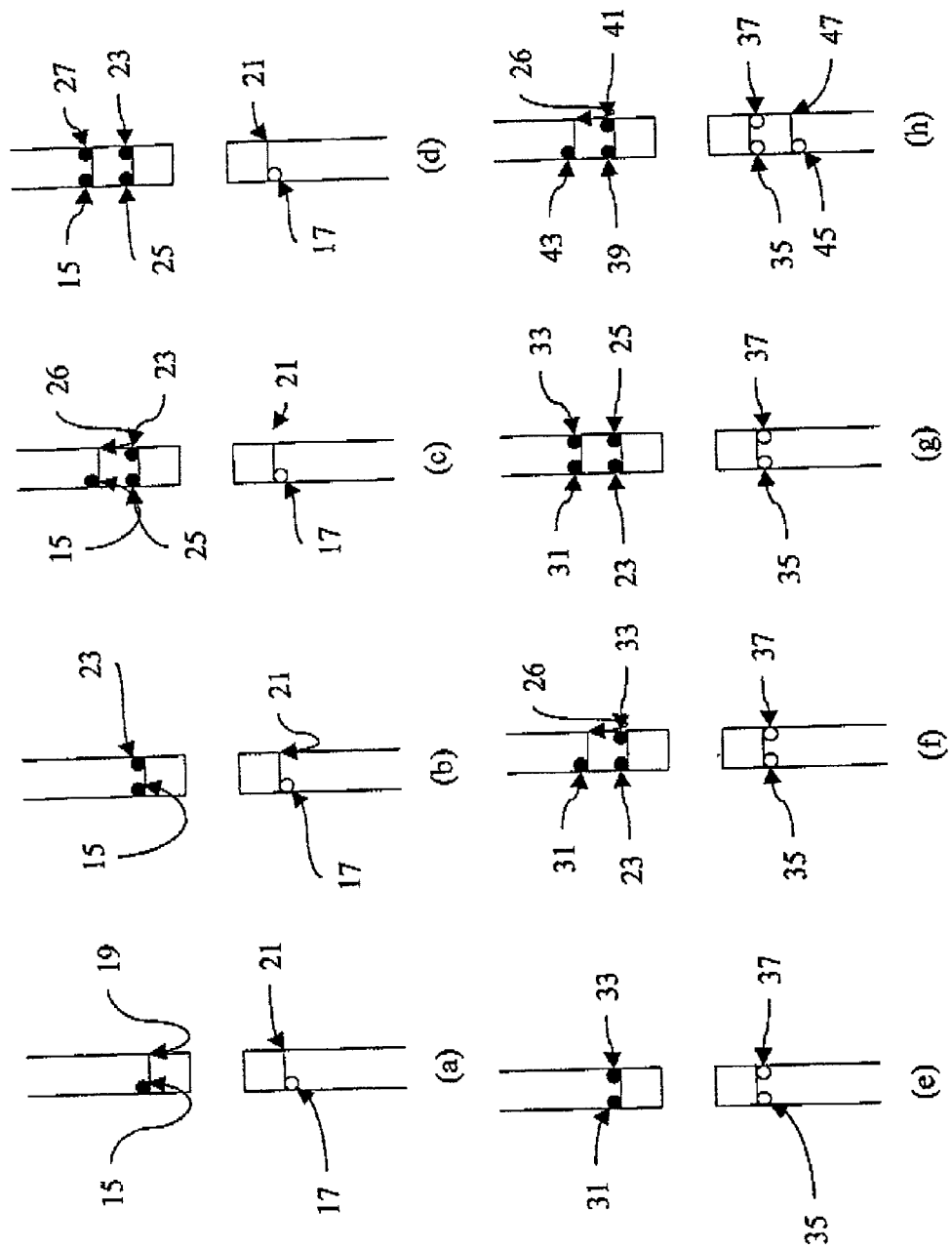
FIGS. 2a to 2m schematically illustrate some of the types of excitons which may be formed.

FIG. 2a shows the simple single exciton. Here, a single electron 15 is located in the lowest conduction band level 19 and a single hole 17 is excited into the lowest valence band level 21. This represents the simplest case. If the dot is weakly illuminated with radiation which has an energy larger than that of the bandgap, then a single exciton is formed.

It may be possible in some devices to add an excess electron 23 to the conduction band level 19 of the quantum dot 1 prior to illuminating the device. In this situation, when a photon is absorbed, an electron 15 is excited in conduction band level 19 and a hole 17 is excited in valence band level 21, and a negatively charged single exciton is formed in the dot. In the negatively charged single exciton, there are two electrons in the conduction band and one hole in the valence band. The two electrons are identical and cannot be distinguished, but we give them different labels for convenience.

In FIG. 2b, a single electron 23 is added to the conduction bands prior to illumination to excite an electron hole pair. In FIG. 2c, two electrons 23 and 25 are added to the conduction band 19 prior to illumination of the device to excite an electron 15 hole 17 pair. The maximum number of electrons which can be accommodated in any confined energy level of the quantum dot is 2. Thus, the photo-excited electron 15 occupies the second conduction band energy level in the quantum dot 25. This arrangement where there are three electrons in the conduction band and one hole in the valence band forms what is known as a double negatively charged single exciton ($X^2-$). FIG. 2d illustrates a further extension of this principle where the conduction band contains three electrons 23, 25 and 27 where electrons 23 and 25 are contained in the first conduction band level 19 and one in the second conduction band level 26. Upon illumination, an electron hole pair is excited so that the hole 17 populates valence band level 21 and the electron 15 populates second confined energy level 26. This forms the so-called triple negatively charged single exciton ($X^3-$).

FIG. 2e shows a further variation. Here, neither the conduction band 3 nor the valence band 5 are populated prior to illumination. Here, upon illumination, two electrons 31 and 33 are excited into lowest conduction band level 19 and two holes 35 and 37 are excited into lowest valence band level 21. This arrangement forms the neutral biexciton ($X_2$).

As explained with reference to the single exciton of 2b, the conduction band may be populated with electron 23 prior to irradiation When two electrons 33 and 31 and two holes 35 and 37 are excited by the incident illumination. In FIG. 2f, the first excited electron occupies first confined energy level 19. As this energy level is now full due to the presence of excess carrier 23, the second excited electron occupies second confined conduction band level 26. As there are no excess holes, photo-excited holes 35 and 37 occupy the ground valence band energy level 21. This arrangement forms the negatively charged biexciton ($X^-_2$).

FIG. 2g shows schematically the doubly charged biexciton ($X_2^{2-}$) where there are four electrons, the two photo-excited electrons 31 and 33 located in upper conduction band level 26 and the two excess electrons 23 and 25 located in the ground conduction band level 19. Two holes 35 and 37 are photo-excited into the valence band level 21. Similarly, the triply charged biexciton may be formed. In this case, there will be five electrons and two holes. As each conduction band level can only accommodate two electrons, then the triply charged biexciton would need to have three confined levels formed within the quantum dot conduction band.

In addition to the biexciton illustrated schematically in FIG. 2e, it is also possible to excite three electrons and three holes as shown in FIG. 2h to form the neutral triexciton ($X_3$). Here, two of the three photo-excited electrons 39 and 41 are located in the lowest conduction band level 19 whereas the third photoexcited electron is located in the upper conduction band level 26. Similarly, because the confined energy levels of the valence band can only accommodate two holes, two of the photo-excited holes 35 and 37 are located in the first confined valence band energy level 21 whereas the third photo-excited hole is located in the second confined valence band energy level 47. It should be noted that electrons and holes are referred to as first excited, second excited, this does not mean to suggest the order in which they are excited, it is just used as a nomenclature to distinguish between the electrons and holes populating the different levels within the dots.

Similarly, as explained in relation to the single and biexcitons, the conduction band can be doped with one, two, three etc more electrons in order to form singularly, doubly, triply etc charged triexcitons.

Previously, the explanation has concentrated on the idea of adding excess electrons to the quantum dot in order to form charged excitons. However, it is also possible to positively charge excitons by adding excess holes to the valence band. In FIG. 2i, an excess hole 51 is added to valence band level 21. The photo-excited electron hole pair 15 and 17 are excited so that the electron 15 populates the lowest conduction band level 19 and the hole 17 populates the valence band level 21. Due to the excess hole 51 in the valence band level, the dot contains a positively charged single exciton (X+). FIG. 2*j* shows a quantum dot containing a double positively charged single exciton ($X^2+$). Here, the quantum dot 1 is doped with two excess holes 51 and 53 in the first confined energy level of the valence band 21. An electron hole pair is then excited so that an electron 15 occupies the first energy level 19 of the conduction band and a hole 17 occupies the second energy level 55 of the valence band. Thus, the dot contains three positively charged holes and one negatively charged electron.

FIG. 2*k* shows a triple positively charged single exciton ($X^3+$). A single electron 15 is located in the first energy level 19 of the conduction band and four holes 17, 51, 53 and 57 located with two holes 51 and 53 in first valence band level 21 and two holes 17 and 57 in second valence band level 55.

In addition to the singularly charged excitons, it is also possible to produce positively charged bi-excitons as shown in FIGS. 2*l* and 2*m*. In FIG. 2*l*, there are two electrons 31 and 33 located in the first conduction band level 19. There are also three holes 61, 63 and 65 located in the first 21 and second 55 levels of the valence band.

In order to achieve this structure, the valence band is populated with one excess hole prior to exciton of two electron hole pairs to form a positively charged bi-exciton ($X_2+$).

FIG. 2*m* shows the doubly positively charged biexciton ($X_2^2+$) where there are two electrons 31 and 33 in the conduction band 19 and there are four electrons in the valence bands 21 and 55. The charged bi-exciton is formed by introducing two excess holes into conduction band level 21 prior to illumination of two electron hole pairs. The multiple electron and hole excitons shown in FIGS. 2*b* to 2*m* decay in a similar manner to that of a simple exciton shown in FIG. 2*a*. In FIG. 2*a*, the electron 15 and the hole 17 eventually recombine to emit a photon having the single exciton wavelength.

Figure 3:
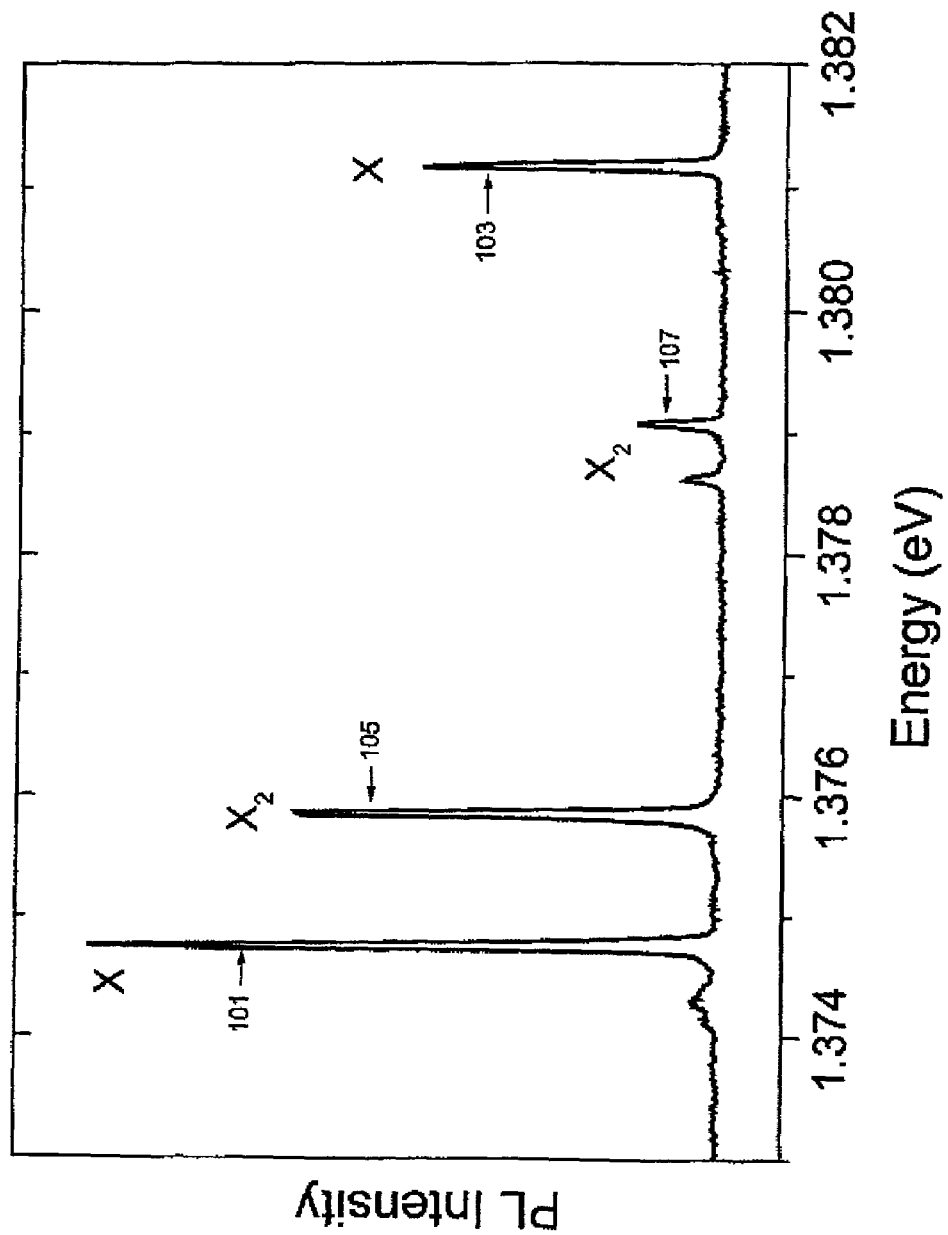
FIG. 3 is a photo luminescence spectrum where luminescence intensity is plotted against photon energy illustrating the spectra from a single neutral exciton (X), a neutral biexciton ($X_2$), a charged bi-exciton ($X_2^*$) and a charged single exciton ($X^*$)

FIG. 3 shows the emission spectrum of a quantum dot. Peak 101 arises from decay of the single exciton shown in FIG. 2*a*. FIG. 2*b* previously described shows the negatively charged single exciton and FIG. 2*l* shows the positively charged single exciton. Both of the singularly charge excitons decay by a single electron 15 combining with a single hole 17 to emit a photon. Due to the presence of the excess electron 23 (as shown in FIG. 2*b*) or the excess hole (51) as shown in FIG. 2*i*, the transition energy of this dot is modified and the energy of a photon derived from a charged single exciton is higher than that from the single, neutral exciton. In FIG. 3, the charged exciton peak is shown as 103.

FIG. 2*e* illustrates a dot containing a bi-exciton. Peak 105 arises from the recombination of a single electron with a single hole in the biexciton state (FIG. 2*e*) to leave a single electron in the conduction band and a single hole in the valence band level 21. It is seen at a slightly higher energy than that of the simple single exciton decay 101. Thus, the bi-exciton radiatively decays to leave behind a single exciton. When the remaining electron and hole combine a further photon is emitted at the energy of peak 101.

Peak 107 is due to the decay of a singularly charged bi-exciton, for example, the negatively charged bi-exciton of FIG. 2*f* or the positively charged bi-exciton of FIG. 2*l*. When a charged bi-exciton decays, a single electron from the conduction band level 19 combines with a single hole from the valence band level 21. The decay leaves behind a charged single exciton which will decay at the energy of peak 103.

The photoluminescence was excited by a laser energy of 1.55 eV and power of 0.4 μW focussed to a spot of 1 μm in diameter. The sample was maintained at a temperature of 5K.

Figure 4:
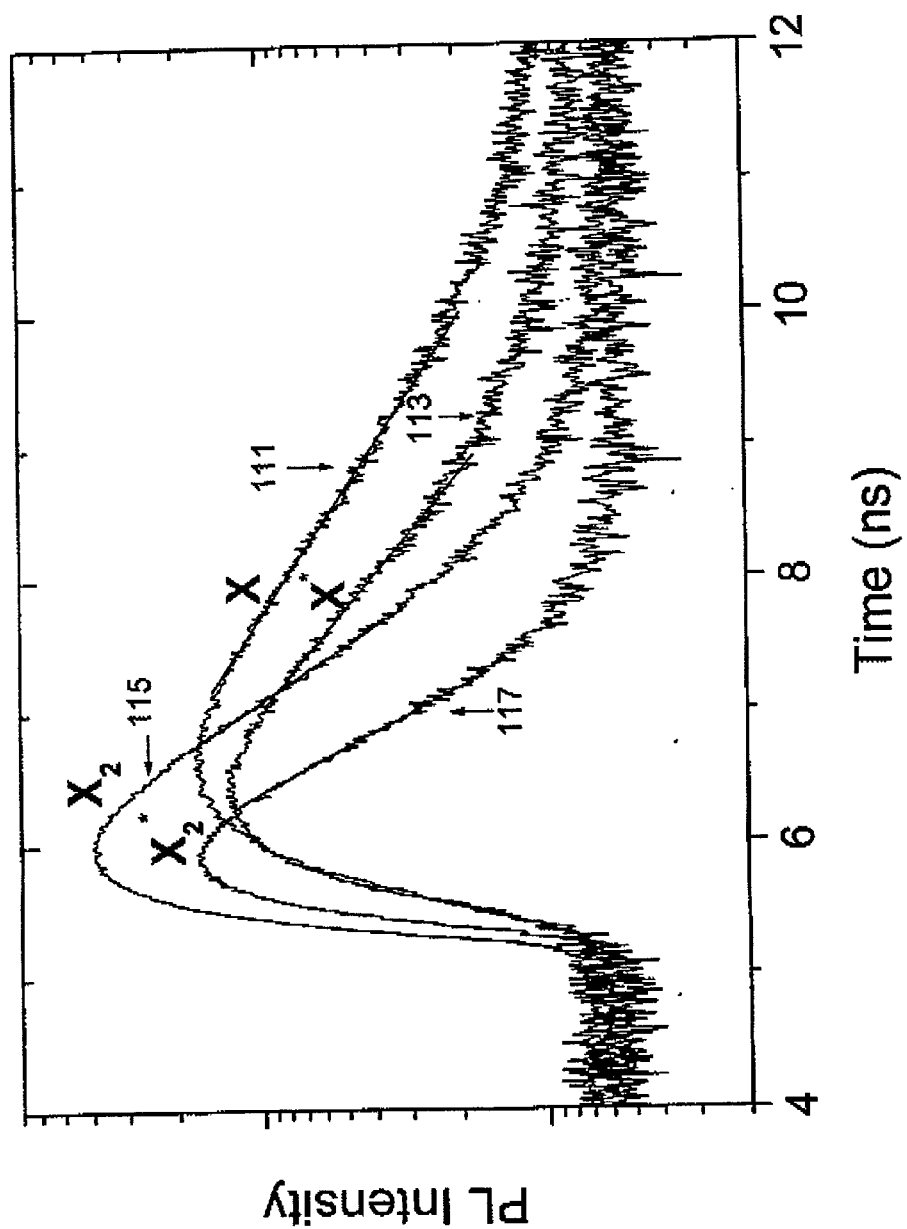
FIG. 4 illustrates time resolved photo luminescence traces for the exciton transitions of FIG. 3.

FIG. 4 shows time resolved luminescence spectra recorded for the various excitonic transitions after excitation by a 1 ps laser pulse and at an energy of 1.55 eV and a laser power of 3.2 μW. Trace 111 corresponds to the single simple exciton decay. It displays an exponential decay with a time constant of 1.36 ns. The time resolved photo luminescence due to the singularly charged single exciton is shown as line 113, for which the decay time is 1.07 ns. Trace 115 corresponds to the time resolved photo luminescence of the neutral bi-exciton. The decay time here is 0.59 ns. The photo luminescence spectra for the singularly charged bi-exciton is shown as trace 117, with a decay time of 0.52 ns.

The decay time for both of the bi-excitons is seen to be much shorter than that of the single excitons 111 and 113. This has serious physical ramifications for a single photon emitter operating at the biexciton photon energy. In such single photon devices, there is always a jitter which occurs due to the uncertainty in the time after excitation that the photon is emitted. However, a shorter radiative decay time, as observed from the biexciton, reduces this jitter. This is advantageous because it means Mat the single photon detector can be gated on for a shorter time and will hence be less susceptible to noise. Another advantage of the faster recombination time is that the single photon emitter can be triggered at a higher clock rate.

FIGS. 5*a* to 5*d* show four photo luminescence spectra recorded at different laser powers. To avoid unnecessary repetition, the same reference numerals are used to identify the peaks as those in FIG. 3. The single simple exciton peak 111 can be seen clearly in each of the diagrams. The neutral biexciton peak is only really identified in FIG. 5*b* where the energy is raised to 0.1 μW. In FIG. 5*d*, (where the laser power is 1 μW) the bi-exciton peak is seen to be nearly the same strength as the single neutral exciton peak. Furthermore, the charged bi-exciton peak 117 is seen to strengthen also.

Figure 6:
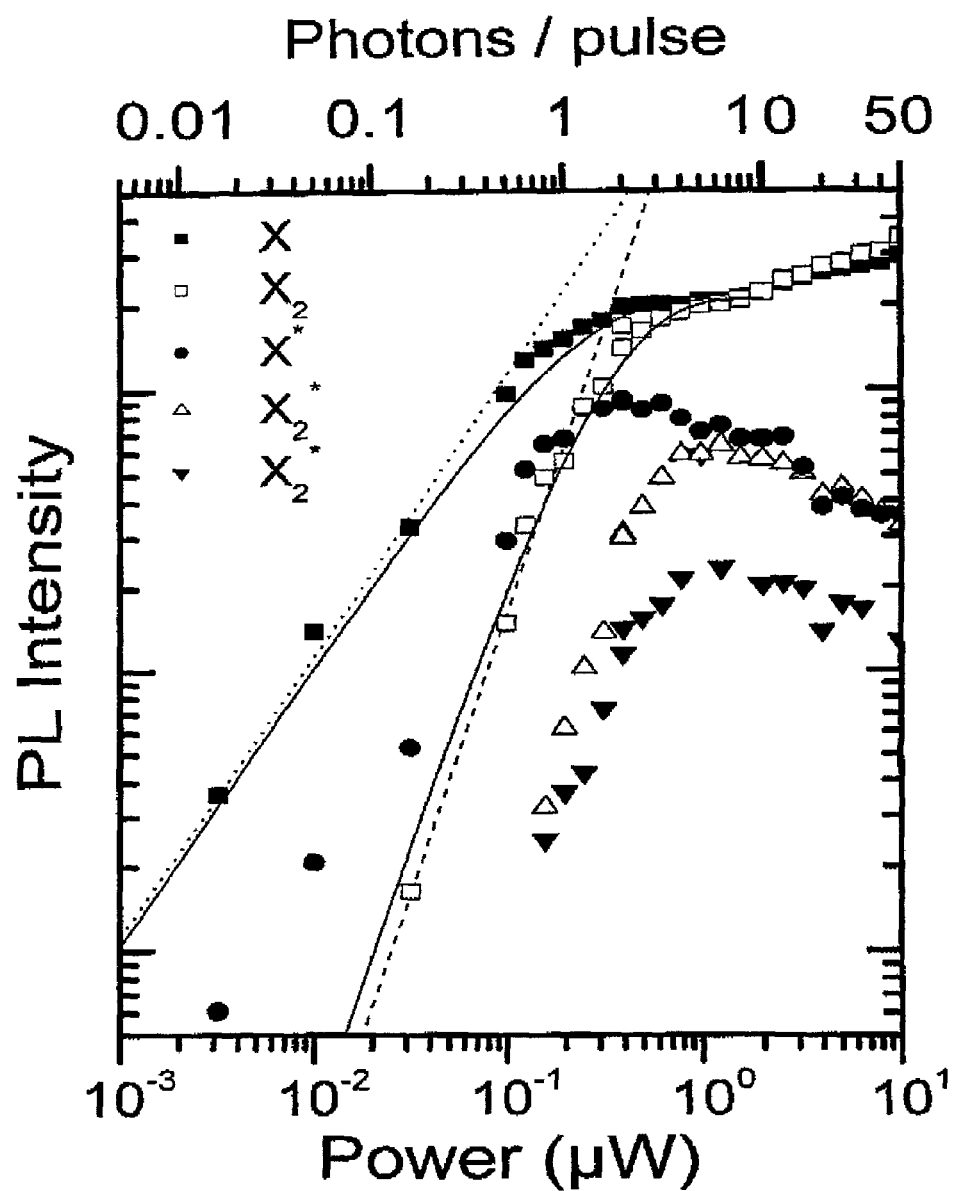
FIG. 6 is a plot of logarithmic photo luminescence intensity against logarithmic laser power for the single neutral exciton emission, the neutral bi-exciton emission, the charged single exciton emission and the charged bi-exciton emission.

FIG. 6 shows a plot of photo luminescence intensity versus incident power. The intensity of the simple exciton is shown as solid squares, the neutral biexciton as hollow squares, the singularly charged single exciton as solid circles, and the singularly charged biexcitons are shown as open or solid triangles.

As the laser power is increased, the intensity of the single neutral excitons (full squares) increases linearly with the incident power, the dotted line indicates a linear dependence of the intensity on the power. On the other hand, the biexciton peak shows a quadratic (dashed line) dependence on laser power.

It can be seen that these two lines converge, indicating that at higher laser pulse powers, the intensity of the single exciton peak is substantially equal to that of the bi-exciton peak. Eventually the signal from both the single excitons and the bi-excitons saturate, In this particular example, this is seen to occur around 0.4 μW. In this regime, it is believed that essentially the laser is operating at a power where there are at approximately 2 photons per laser pulse, absorbed in the region close to the quantum dot, so that the photo excited carriers are captured by the dot.

Figure 5:
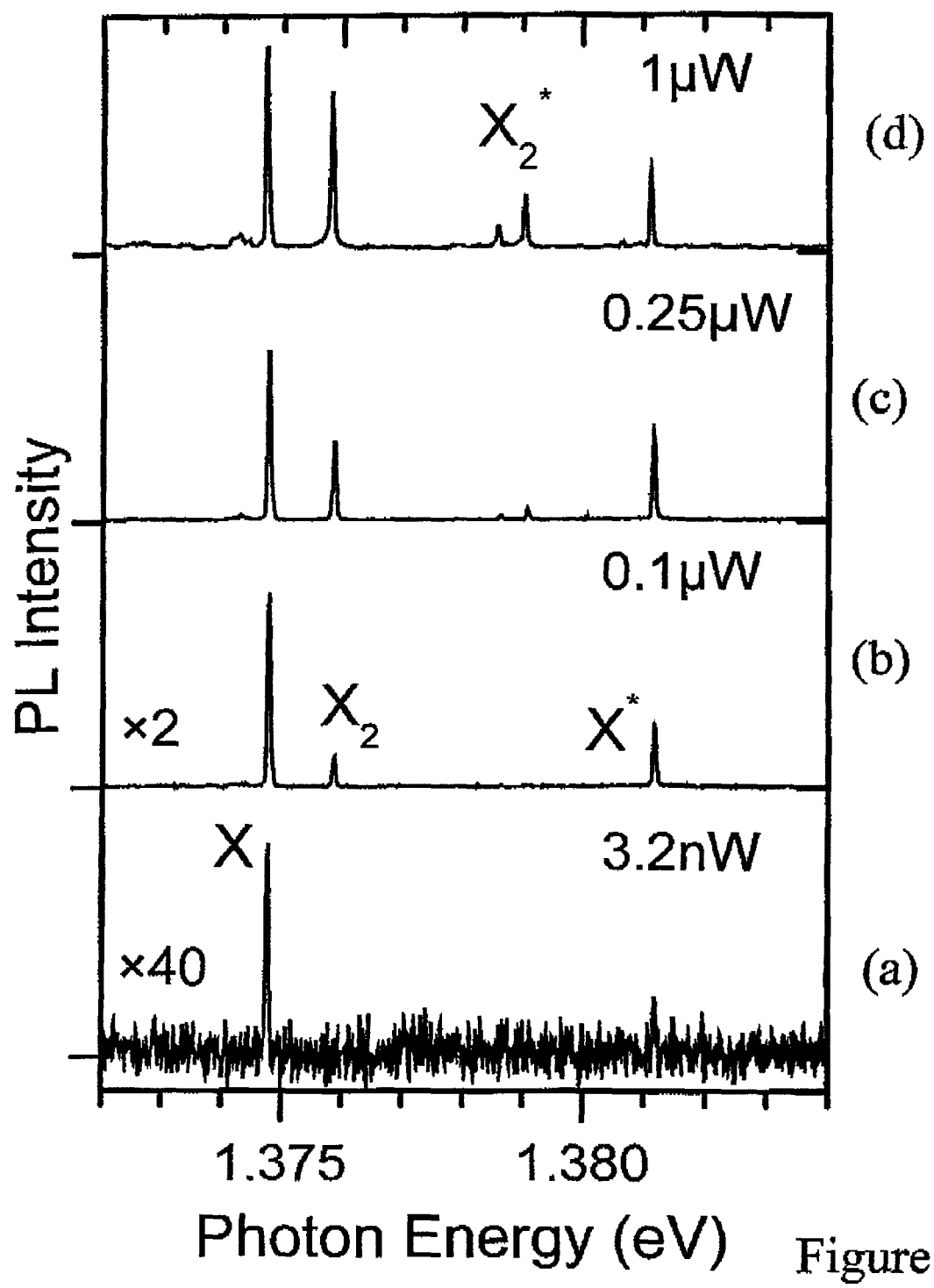
FIGS. 5a to 5d illustrates a plot of photo luminescence intensity against photon energy for a laser power of 3.2 nW (FIG. 5a), 0.1 µW (FIG. 5b), 0.25 µW (FIG. 5c) and 1 µW (FIG. 5d)

Therefore, from FIGS. 5 and 6, it can be seen that using higher incident laser powers causes excitation of the higher order excitonic states such as the biexciton. From FIG. 4, it can be seen that the higher excitonic states have more potential for producing commercially useful quantum devices an the single neutral exciton which has been previously disclosed.

The results shown in FIGS. 5 and 6 illustrate how higher laser power can be used in order to favour biexcitons and higher order excitons. Also, singularly and doubly charged single excitons can also be observed using a higher power laser.

Figure 7:
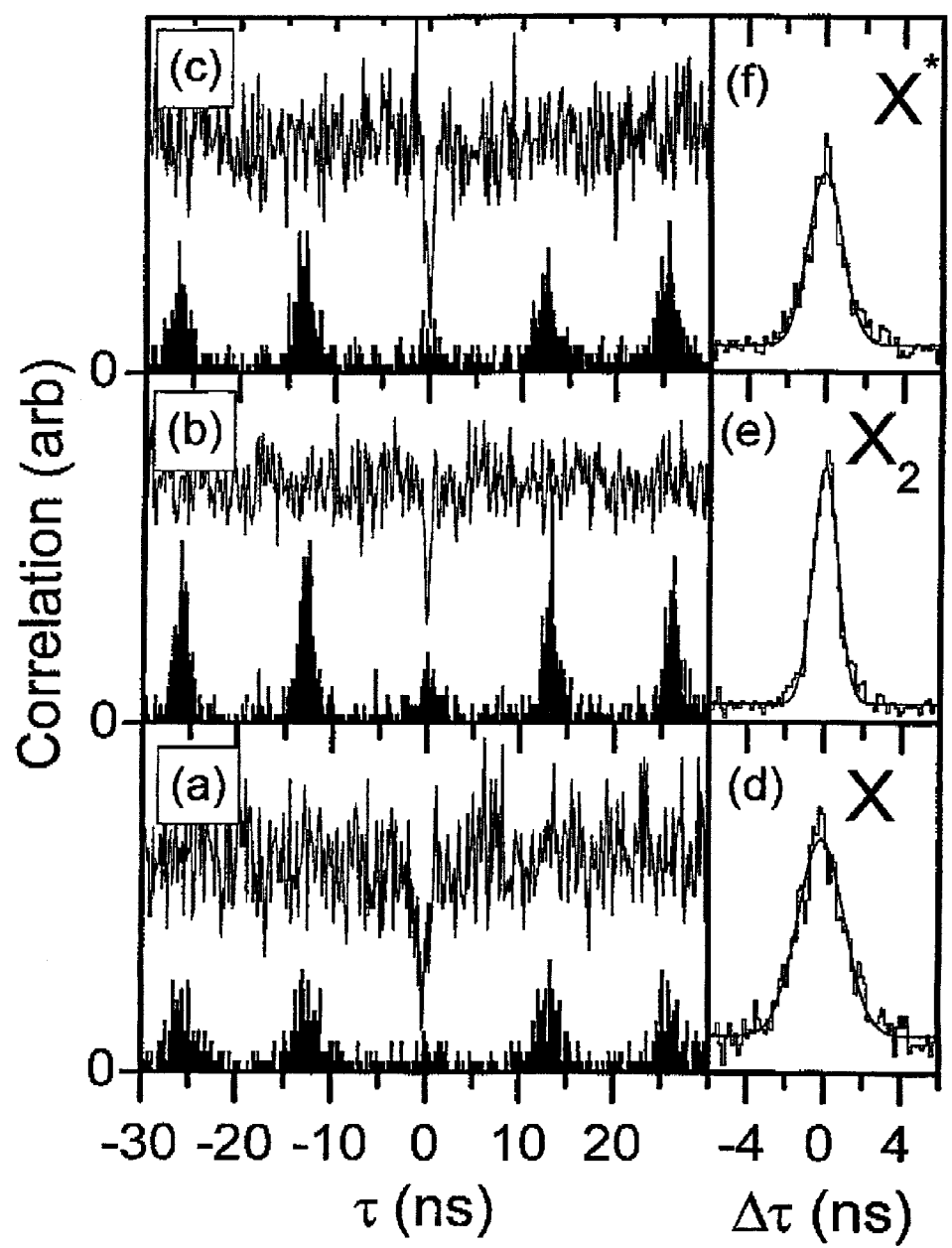
FIGS. 7a to 7f show results from correlation measurements illustrating suppression of two photon emission from a device in accordance with a preferred embodiment of the present invention.

FIG. 7 is a plot of the second order correlation function of photons emitted from a quantum dot.

The experimental system that was used was as follows. The emission from a quantum dot was spectrally filtered using a grating spectrometer to pass only the emission line of interest, for example the neutral bi-exciton, and block all other lines, for example the charged excitons, and the neutral simple exciton.

The filtered emission was then used in a Hanbury-Brown and Twiss experiment, whereby the stream of photons is split into two separate paths by a 50/50 beam splitter, and detected by two single photon detectors. One detector is used to start a timer, and the second detector is used to stop a timer. This experiment allows the time between the detection of two photons, $\tau$, to be measured. The second order correlation function is determined from the frequency of start-stop events as a function of $\tau$.

FIG. 7 shows the second order correlation function of photons emitted by (a) the neutral exciton, (b) the neutral bi-exciton and (c) the charged exciton, under CW laser excitation, (lines showing dip) and pulsed laser excitation (bars showing peaks). The laser energy was set to 1.55 eV, and the powers used for pulsed excitation were 0.2 µW, 0.8 µW, and 0.2 µW for (a), (b) and (c). The powers used for CW excitation were 1.5 µW, 15 µW and 1.5 µW for (a), (b) and (c).

At zero delay ($\tau=0$) the dip in the CW correlation demonstrates that it is relatively unlikely to detect two photons at the same time. In the pulsed correlation, the fact that the zero delay peak is much weaker than the others demonstrates that the emission of two photon pulses is strongly suppressed for emission from the exciton, bi-exciton and charged exciton.

FIGS. 7(d) to 7(e) shows the time distribution, or jitter, of emission from the exciton (d), biexciton (e) and charged exciton (f), relative to the centre of the peaks. The narrow peak for the bi-exciton emission relative to the exciton peak shows a reduction in timing jitter for the bi-exciton by a factor of 1.9. In addition, the charged exciton shows a smaller reduction in peak width compared to the simple exciton, by a factor of 1.3.

The sharp peaks associated with the biexciton also make it particularly desirable for use with a time-gated detector. As there is much noise between the peaks, generally detectors are switched off when no photon is expected. As the peaks are sharp for the bi-exciton, the detector can be switched off for longer between the peaks. Also, as the peaks are sharper, it is possible to modulate the source at a higher frequency without the peaks overlapping. Thus, a faster transmission rate can be achieved.

These measurements demonstrate the improved performance of a single photon emitter using photon emission from the bi-exciton, rather than the exciton, in a quantum dot.

The measurements were taken using a simplified device where about 2 monolayers of InAs were grown on a GaAs buffer and substrate. The InAs layer was capped with 300 nm of GaAs. The source was then etched into 0.8 µm mesa to try and produce one dot per device. The laser was focussed onto the dot using a microscope lens and collected using a microscope lens.

In addition to modulating the laser power in order to enhance certain transitions, it is also possible to modulate the photon source using a schottky gate or an electric field in order to fix the excess charge density of the conduction band or valence band of the quantum dot. This is shown schematically in FIGS. 8a to 8c.

Figure 8:
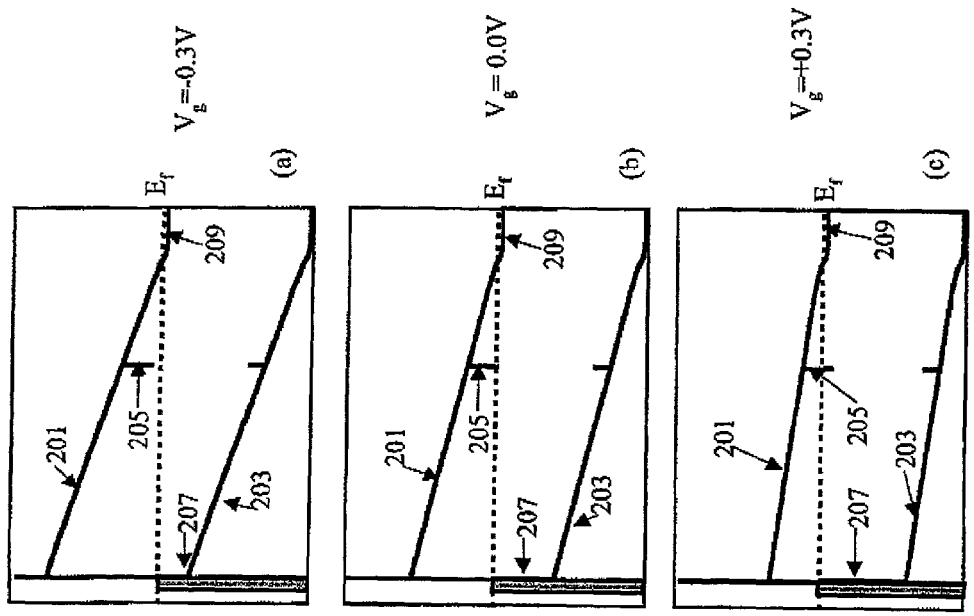
FIGS. 8a to 8c illustrate a schematic band structure of a photon source where the excess carrier concentration in the quantum dot cm be controlled using a gate bias of +0.3 volts (FIG. 8a), 0 volts (FIG. 8b) and −0.3 volts (FIG. 8c)

FIG. 8a shows a schematic band structure illustrating the conduction band 201 and the valence band 203 of a photon source comprising quantum dot 205. The device has a gate 207 which can bias the device with respect to device base 209. Device base 209 is a n+ contact This n+ contact also sets the Fermi layer $E_f$ of the device. In FIG. 8a a negative bias of −0.3V is applied to the gate 207 relative to the base 209 so that the conduction band edge of the quantum dot 205, which is illustrated by reference numeral 211, is located above the Fermi layer $E_f$. Similarly, the valence band edge 213 of quantum dot 205 is located well below the Fermi layer $E_f$. In this situation, as the Fermi layer which defines the energy of the carriers in the device is below the conduction band edge 211 and above the valence band 213, then the conduction band of dot 205 usually contains no excess electrons and the valence band of dot 205 contains no excess holes. The situation is changed in FIG. 8b. Here, the voltage applied between metal contact 207 and n+ contact 209 has been changed to 0V in order to move the conduction band edge 211 below the Fermi layer $E_f$. The conduction band edge 211 lies only just below the Fermi level $E_f$ so that only one electron is contained within quantum dot 205. This allows the formation of the singularly charged negative exciton of FIG. 2b or the singularly charged biexciton of FIG. 2f.

FIG. 8c shows the device when the bias has been finer changed to +0.3V and the conduction band edge 211 lies even further below the Fermi level $E_f$. Thus, the quantum dot 205 is now populated with two or even more electrons such that it can form the double and triple charged negative excitons shown in FIGS. 2c and 2d or the doubly charged biexcitons.

It is also possible to bias or configure the device so that the valence band edge 213 is raised above the Fermi level $E_f$. This allows the number of excess carriers within the valence band to be fixed in order to produce the positively charged excitons or bi-excitons illustrated schematically in FIGS. 2i to 2m.

Previously, we have discussed the device with reference to exciting electrons and holes using a pulsed laser. A typical arrangement for this apparatus is shown in FIG. 9.

Figure 9:
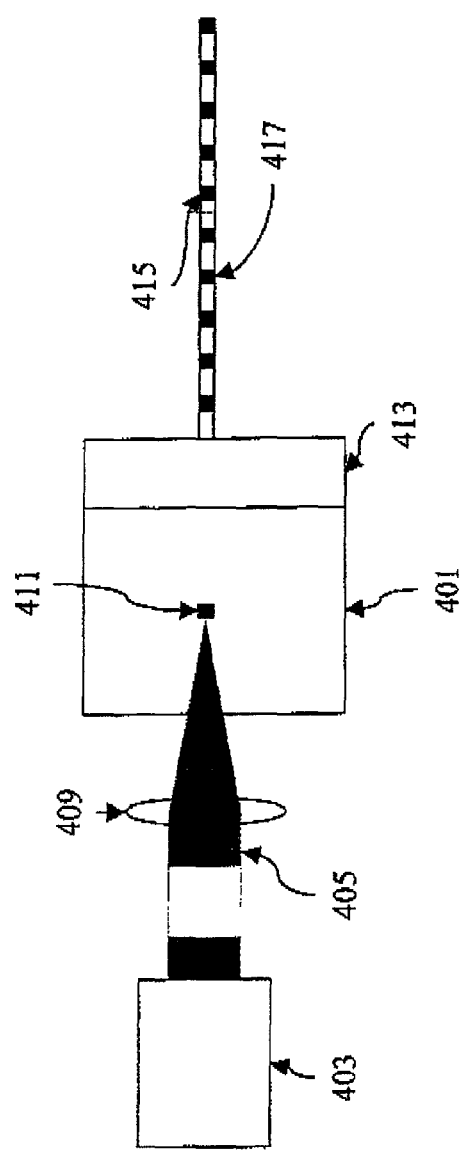
FIG. 9 shows an embodiment of a device in accordance with the present invention where the supply means comprises a pulsed laser diode and where a filter is provided.

FIG. 9 shows an embodiment of the present invention. In this simplified example, single photon source 401 comprises a single quantum dot 411. The single photon source is driven by pulsed laser 403 which produces pulsed beam of radiation 405 having an energy sufficient to excite a desired transition within the quantum dot 411.

Lens 409 focuses the pulsed radiation 405 onto quantum dot 411 and at least one electron hole pair are excited in the conduction and valence bands per laser pulse. A first pulse of radiation arrives at the quantum dot 411 and excites one, two or more electron hole pairs. As previously explained, the number of electron hole pairs excited is dependent to a large extent on the chosen power of the laser. In this example, it is presumed that a biexciton has been excited since the biexciton emission has less jitter than the single exciton emission and thus may be more desirable for a commercial photon source.

The length of the laser pulse is desirable shorter than the recombination time of the emission process of interest. In this example, the biexciton emission is the desirable emission, hence, the pulse length of the laser is less than the biexciton emission time. If the biexciton is excited, then photon emission from the bi-exciton will occur first, followed by a second photon emitted by the single exciton. In this example, we are not interested in the single exciton emission and since single photon emission is required, the emission from the exciton is blocked using filter 413 to avoid. Filter 413 can be an energy filter (configured to allow the transmission of photons at the biexciton emission energy or to allow transmission of charged and neutral bi-exciton, but block charged and neutral exciton), a polarisation filter (since the two photons emitted due to the biexciton emission and the single exciton emission will have opposing polarisations) or a time filter (since the biexciton emission will occur before the single exciton emission).

The photons due to the biexciton emission are then directed into fibre optic cable 415. If the single exciton emission is blocked, then theoretically a single photon 417 with the biexciton frequency will be directed into fibre optic 415 for each pulse from laser 403.

Although the filter 413 is shown as an addition component the filter may be integrated into or onto photon source 401 as will be described with reference to FIGS. 16 to 19.

Figure 10:
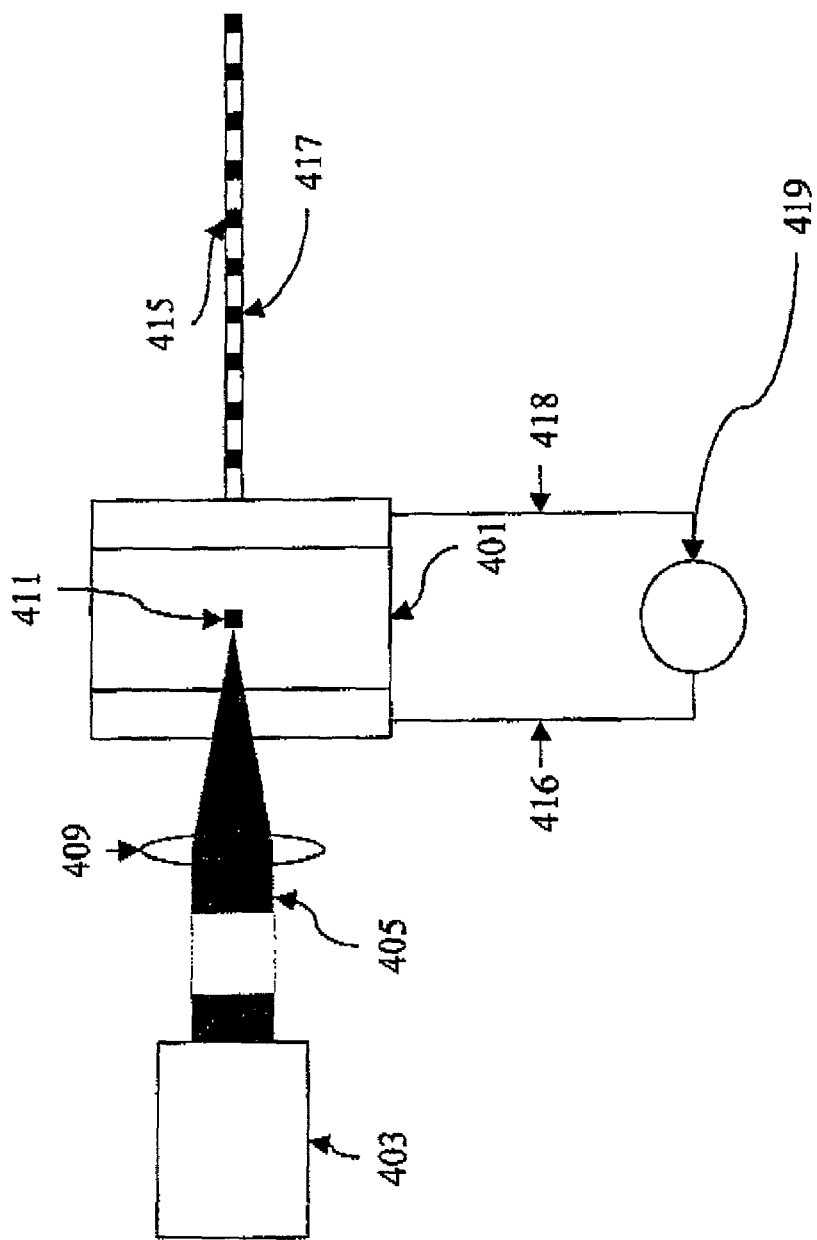
FIG. 10 shows a source in accordance with a further embodiment of the present invention where the supply means comprises a pulsed laser diode and where means are provided for fixing the excess carrier concentration in the dot.

FIG. 10 shows a further embodiment of the present invention which represents a variation on the system of FIG. 9. To avoid unnecessary repetition, like reference numerals will be used to denote like features.

In the system of FIG. 10, the photon source is provided with upper 416 and lower 418 electrodes which are configured to apply an electric field across quantum dot 411. The electrodes 416 and 418 are connected to voltage source 419. The voltage applied by source 419 is selected in order to enhance the probability of n excess carriers within the quantum dot. For example, if the source 419 applies a voltage such that there should be a single excess electron within the quantum dot 411, then a negatively charged single exciton should be produced for each laser pulse. The emission from these excitons is then directed into fibre optic cable 415.

The system of FIG. 10, is illustrated without a filter 413. However, the output from such a photon source can be filtered using energy, time or polarisation as described with reference to FIG. 9. Further, the apparatus of FIG. 10 can also be used to fix the probable number of excess carriers in the quantum dot 411 at zero to enhance the production of neutral excitons. The laser power can be chosen depending on the order of the excitons required.

Figure 11:
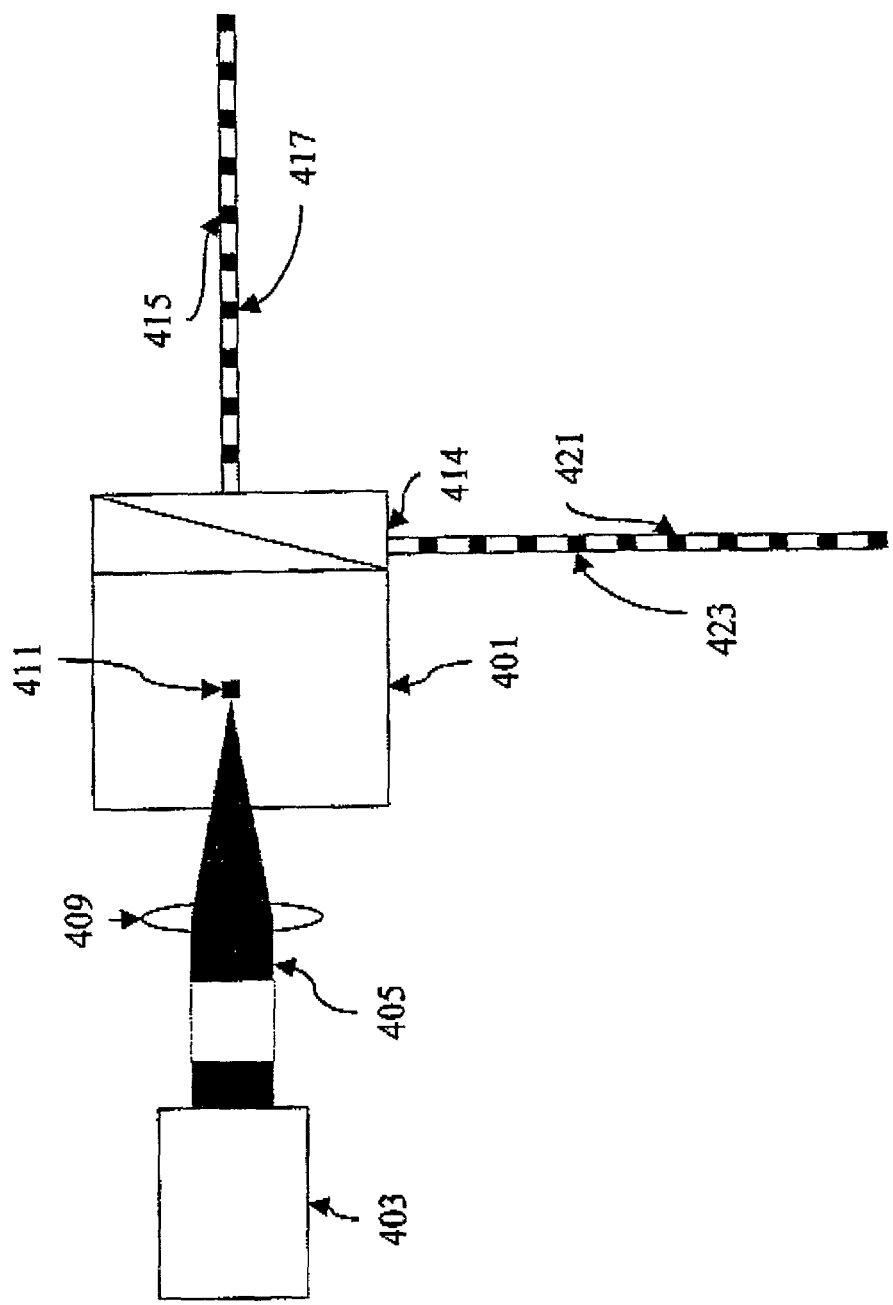
FIG. 11 shows a source in accordance with an embodiment of the present invention configured as an entangled photon source.

FIG. 11 illustrates a further variation on the system of FIG. 9. To avoid unnecessary repetition, like reference numerals will be used to denote like features.

Filter 413 of FIG. 9 was used to block certain emissions. The apparatus of FIG. 11 comprises a separator 414 which directs the photons emitted from photon source 401 either down first fibre optic cable 415 or down second fibre optic cable 421.

Taking the example described in relation to FIG. 9 where a biexciton emission occurs, the separator may be a wavelength separator such as a dichoric mirror which is configured to direct biexciton emissions into first cable 415 and single exciton emissions 423 into second fibre 421.

This type of source is an entangled photon source, where the polarisation and/or phase state of a biexciton is entangled with the polarisation and or phase state of the single exciton emission which follows from the biexciton emission. Measuring the phase and or polarisation of one of the states of the entangled photon pair (i.e. biexciton emission and subsequent single exciton emission) will set the respective state of the other photon of the pair.

The separator may alternatively use the difference in time between the biexciton and single exciton emissions in order to separate the entangled pair or a polarisation measurement may be used.

The apparatus of FIG. 10 may be used with the voltage source 419 and contacts 416 and 418 of FIG. 10 in order to enhance the probability of emission from a particular charged state of an exciton. Also, the filter 413 of FIG. 9 may also be used in order to block unwanted emissions.

Figure 15:
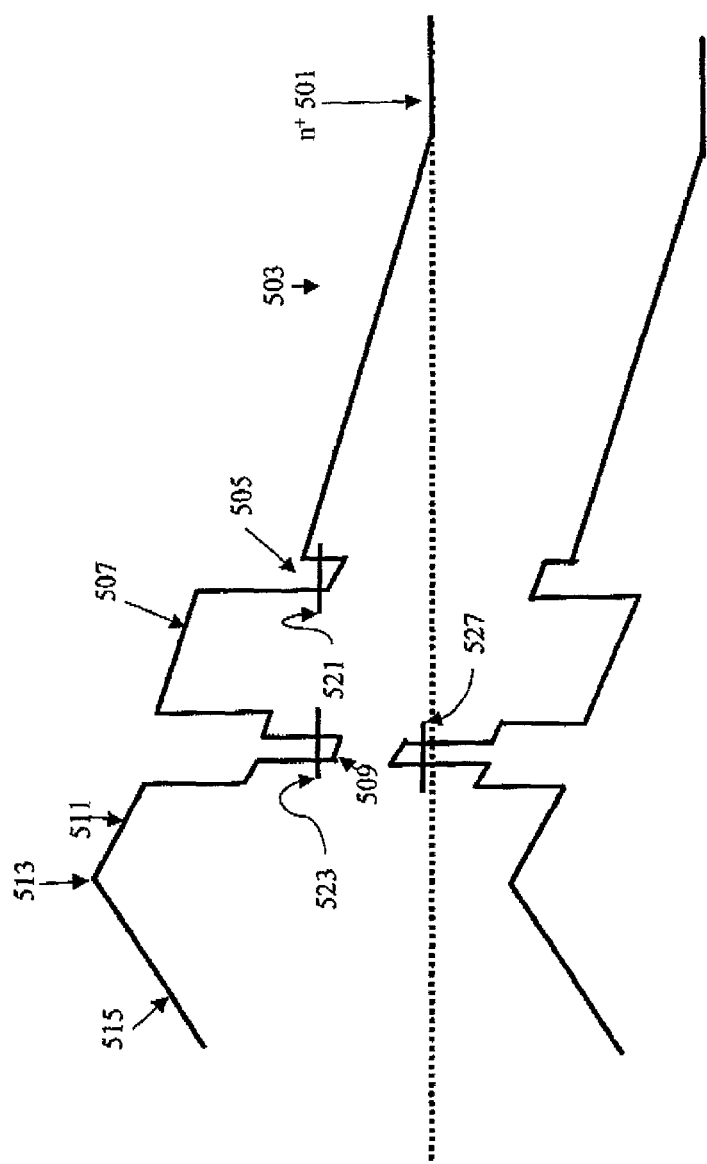
FIG. 15 shows a band structure of the device of FIG. 14 when in an on condition.

FIGS. 9 to 11 related to supplying the carriers to the dot using a pulsed laser. FIG. 15 shows a variation on this arrangement where a continuous wave (CW) laser is used in order to irradiate the dot.

Figure 12:
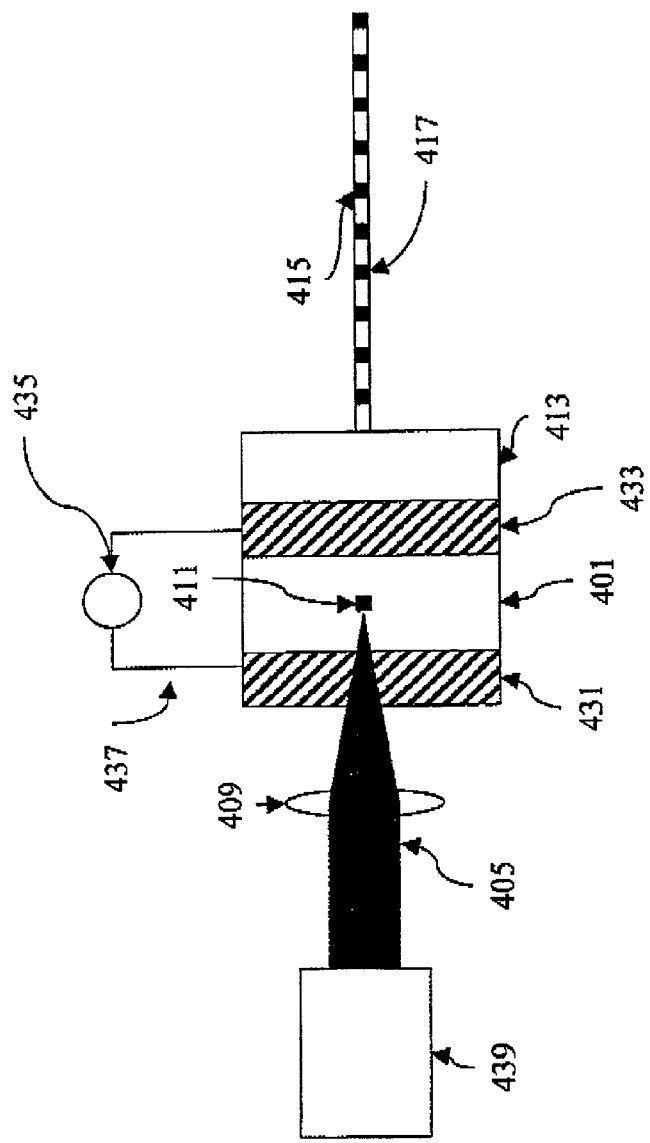
FIG. 12 illustrates a further embodiment of the present invention where the supply means comprises means to vary the transition energy of the quantum dot and a continuous wave laser.

FIG. 12 shows an electrically triggered quantum dot filter. The single photon source 401 is illuminated by a CW (continuous wave) laser 439 with a narrow spectral line width. The CW laser 439 provides, as the name suggests, a continuous intensity and does not emit a pulsed signal. The CW laser excites an optical transition of the quantum dot 411.

The output from the CW laser 439 is focused by lens 409 onto the quantum dot 411 of photon source 401.

The single photon source 401 has a quantum dot 411 which is interposed between a top contact 431 and a bottom contact 433. An AC voltage source 435 is connected across the top contact 431 and bottom contact 433 such that on application of an AC voltage, the field across the quantum dot 411 is periodically varied. This periodic modulation varies the transition energies of the quantum dot.

The CW laser 439 is capable of exciting an optical transition of the quantum dot. The applied periodic modulation varies the transition energy of the dots. Therefore, the input radiation is only capable of exciting an electron and hole into the relevant levels at certain voltage levels applied to electrodes 431, 433. Hence, the period modulation of the voltage applied to electrodes 431 and 433 has a similar effect to pulsing the laser radiation.

The emission may then be filtered using filter 413 and directed into optical fibre 415. As explained with reference to FIG. 9, the laser may be used to excite higher order excitons. Also, the apparatus of FIG. 10 may be used to fix the excess carrier density. Although the photon source of FIG. 10 has contacts which are used to apply an electric field, it should be noted that it is still possible to modulate the transition energy of the dot and fix the excess carrier concentration at the dot transition energy.

An entangled photon source of the type described with reference to FIG. 11 can also be provided using the electrically pulsed source of FIG. 12.

Figure 13:
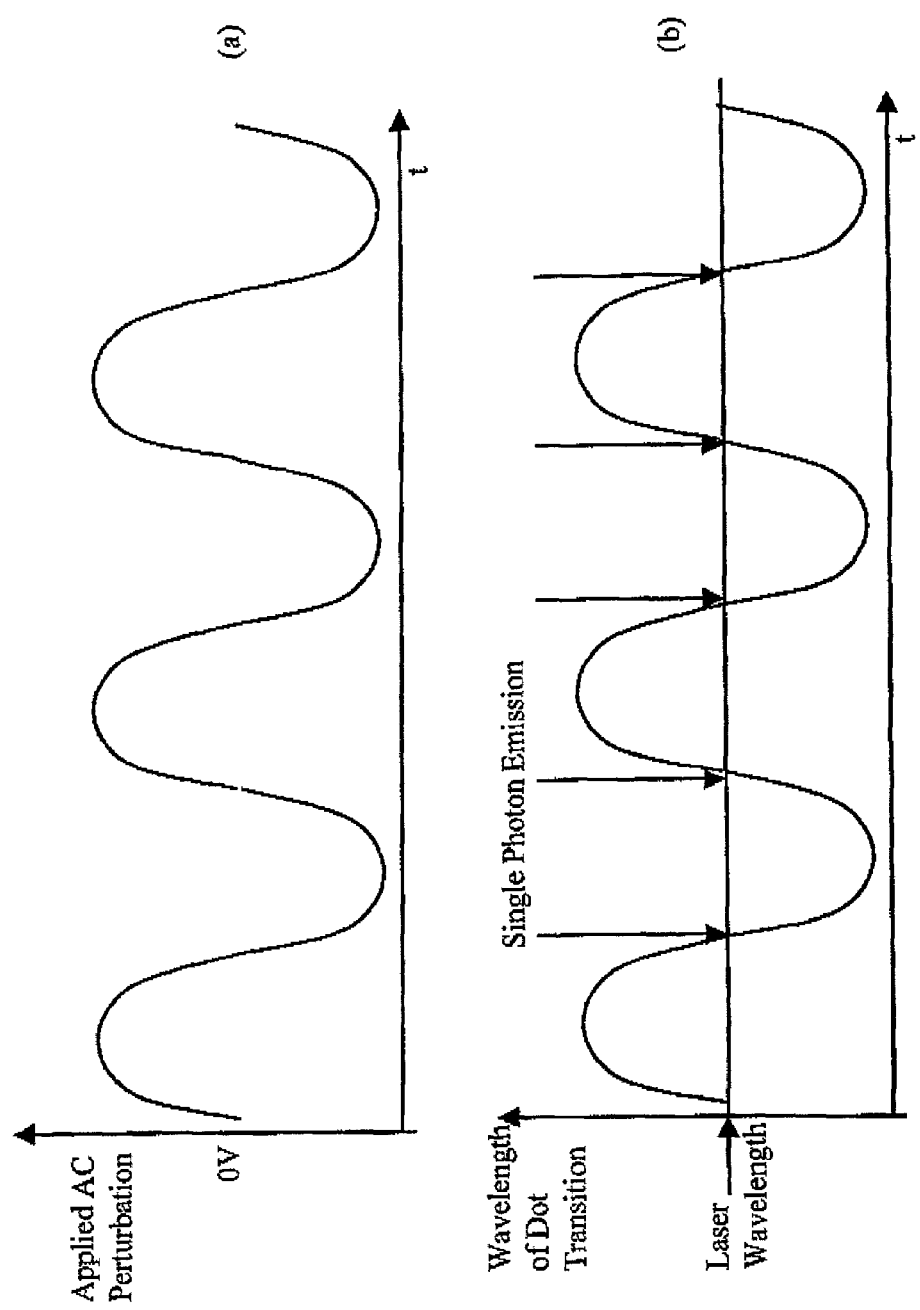
FIGS. 13a and 13b are schematic plots illustrating the variation in the quantum dot transition wavelength with applied AC bias in the embodiment of FIG. 12.

FIG. 13 illustrates the relationship between single photon emission and applied AC perturbation in the device of FIG. 11. In FIG. 13a, applied AC perturbation on the y-axis (arbitrary units) is plotted against time on the x-axis (arbitrary units). In FIG. 13b, the quantum dot transition wavelength (related to the quantum dot transition energy by $E=hc/\lambda$) is plotted on the y-axis and the elapsed time is plotted it the x-axis (arbitrary units).

The time axis in both FIGS. 13a and 13b are identical. It can be seen, that a quantum dot transition wavelength varies periodically with that of the applied AC perturbation. The laser wavelength in this case (that is the applied radiation) is tuned to the transition energy of the quantum dot transition in the absence of any modulation. Photon absorption occurs at the times that the quantum dot transition energy equals that of the laser which occurs twice per period of the modulation. Subsequent recombination results in the emission of a photon. Photons are thereby emitted at time intervals determined by the period of the applied modulation.

The single photon emitter does not always require excitation by illumination. It is possible to introduce the electrons and the holes into the energy levels for recombination by an applied voltage.

Figure 14:
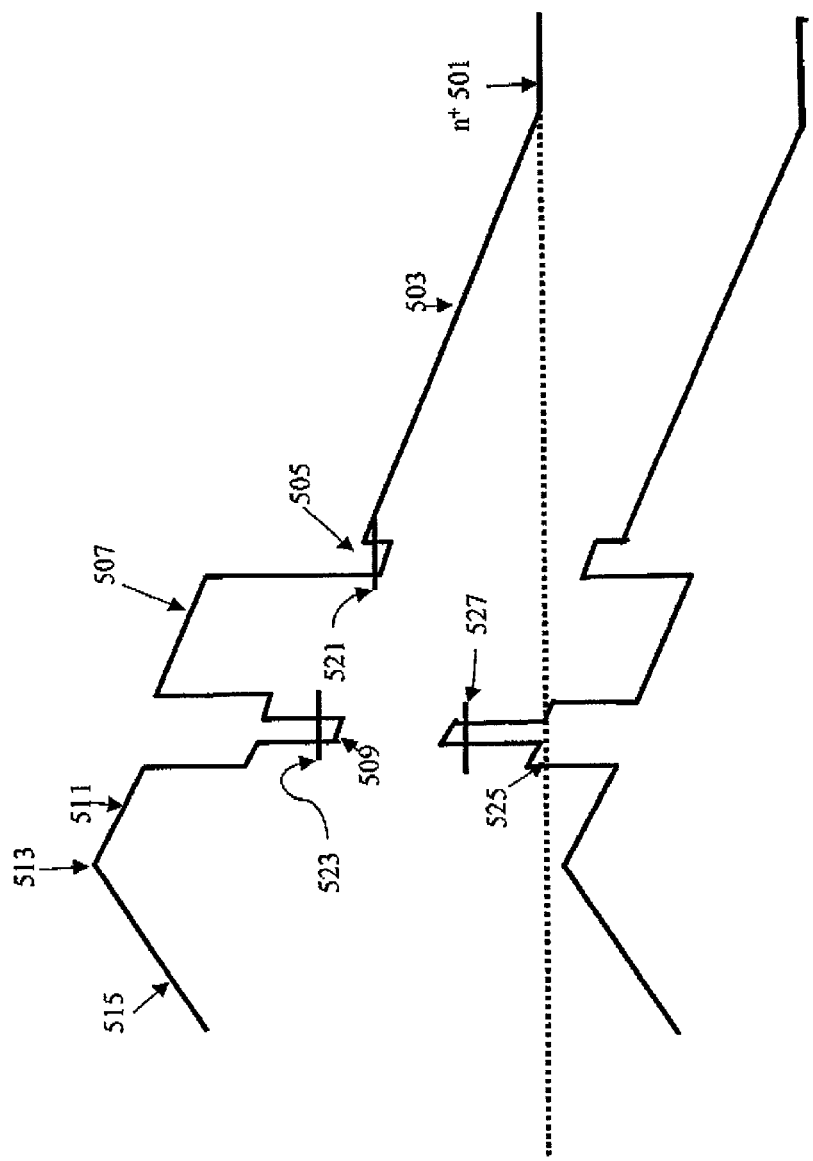
FIG. 14 shows a band structure of an electrically injected quantum dot single photon emitter in accordance with an embodiment of the present invention in an off condition.

FIG. 14 illustrates the band structure for such an electrically operable device. The device comprises a buffer layer 503 formed overlying an upper surface of an n$^+$ injection gate 501. The buffer layer separates the injection gate 501 from an injection layer 505. Electrons can be induced in to injection layer 505. A tunnel barrier 507 is formed overlying an upper surface of injection layer 505. A quantum dot layer 509 is then formed overlying an upper surface of tunnel barrier 507. A p-type doped barrier layer 513 is formed overlying an upper surface of an n-doped spacer layer 511 such that barrier layer 513 separated from the quantum dot layer 509 via spacer layer 511. The structure is finished with a cap layer 515 which overlies an upper surface of the doped barrier layer 513.

Contacts are made to the dot layer 509 and the injection gate 501 such that the injection gate 501 can be biased with respect to dot layer 509. In operation, the device is configured so that doped barrier layer 513 supplies holes to dot layer 509 so that the quantum dots are always populated by holes. Injection gate 501 can be biased with respect to dot layer 509 such that electrons are induced in injection layer 505. Electrons can be injected into the quantum dot layer 509 due to resonant tunnelling trough tunnel barrier 507 by varying the bias between the injection gate and the hole gas 525.

The injection of electrons into the dot layer 509 is regulated by applying a periodic voltage between the dot layer 509 and the injection gate 501.

The bias consists of a periodic stream of pulses between two levels $V_{on}$ and $V_{off}$. FIG. 14 illustrates the band structure for the situation of $V_{off}$ i.e. no carries are injected into the quantum dot 509 and FIG. 15 illustrates the situation for $V_{on}$ where carriers are injected from the injection layer 505 to the quantum dot 509.

The voltage level $V_{off}$ is chosen so that the electron energy level 521 in the injection layer 505 is lower than the level 523 in the quantum dot 509.

The electrons in the electron injection layer 505 have an energy 521. In order to resonantly tunnel through barrier 507 into quantum dot layer 509, the electrons must have an energy equal to that of level 523 shown in the quantum dot. In the $V_{off}$ state, the electrons do not have this energy. Therefore, no tunnelling can take place and hence, no recombination of electrons with holes in the dot can occur.

FIG. 15, shows the state where the potential of the injection gate 501 is raised to $V_{on}$. Under these conditions, the band structure of the device changes so that energy level 521 in the electron injection layer 505 aligns with energy level 523 of the quantum dot and resonant tunnelling of a single electron can occur from injection layer 505 through tunnel layer 507 into quantum dot layer 509. Thus, recombination can occur and a photon can be emitted. It is clear, that as the tunnelling is controlled by switching the potential between $V_{on}$ and $V_{off}$, the control of single photons can be achieved.

The device of FIGS. 14 and 15 can be used to produce higher order excitons and/or can be used to fix the number of excess carriers as described in relation to FIGS. 9 and 10. Also, the entangled photon source of FIG. 11 can also be achieved using the photon source of FIGS. 14 and 15.

Figure 16:
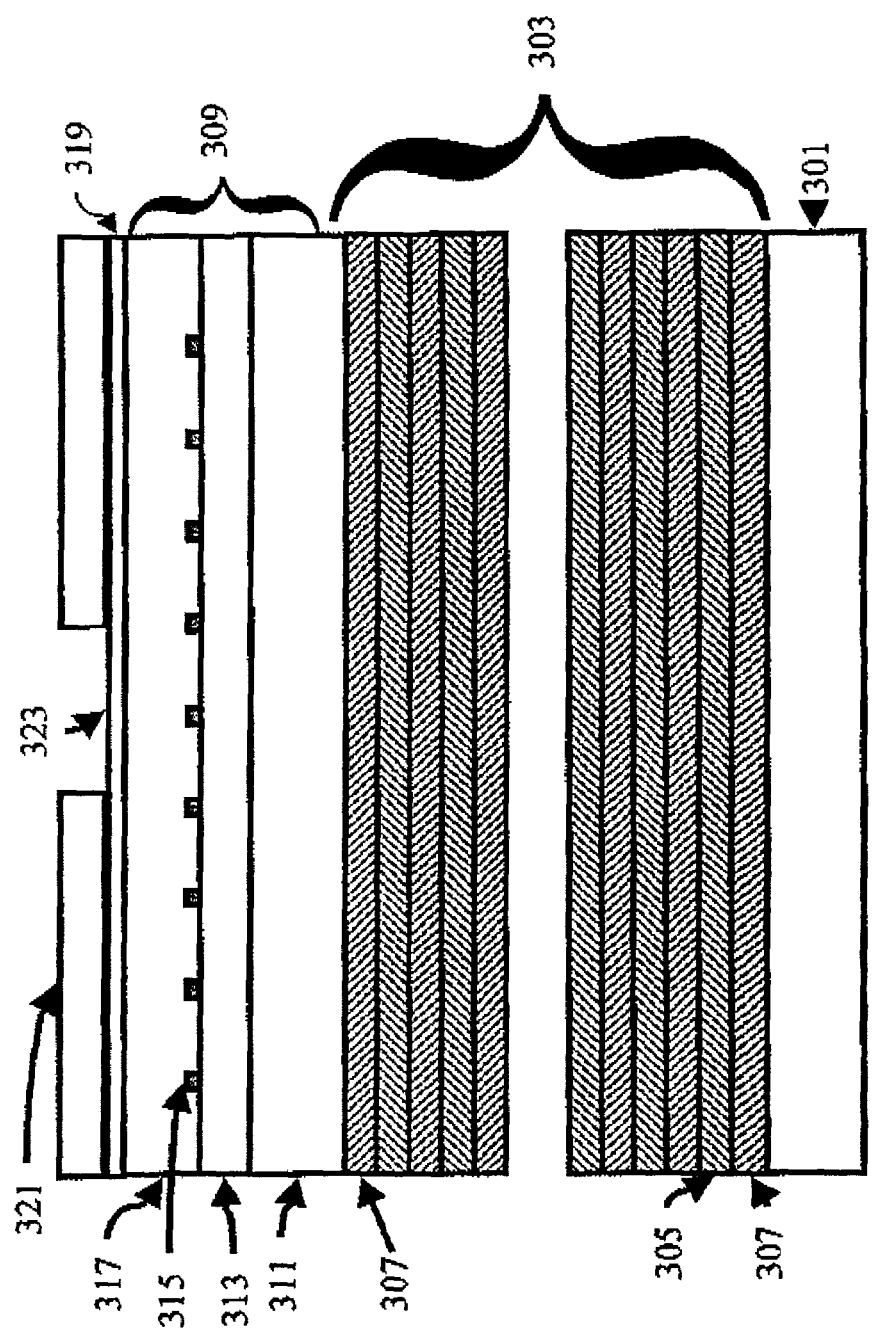
FIG. 16 shows a schematic layer structure of a device in accordance with an embodiment of the present invention.

FIG. 16 illustrates a schematic layer structure for a single photon source which can be used to enhance the desired excitonic transition. The device comprises an n doped GaAs substrate 301. A distributed Bragg reflector 303 is then formed overlying and in contact with the upper surface of said substrate 301. Alternatively, the distributed Bragg reflector 303 may be deposited on a buffer layer which is formed overlying and in contact with said upper surface of the GaAs substrate 301.

The distributed Bragg reflector 303 comprises an alternating sequence of n doped GaAs layers having a thickness of 95.46 nm 305 and n doped AlAs having a thickness of 111.04 nm 307.

The thickness of the layers of the distributed Bragg reflector 303 are chosen in order to make the distributed Bragg reflector 303 highly reflected at the intended device operation wavelength λ. The composition of each adjacent layer is chosen so that there is a high refractive index contrast. This can be achieved by alternating AlAs and GaAs layers. The layers are doped n type by silicon doping during the epitaxial growth process. The optical thickness of each pair of layers is chosen to be as close to λ/2 as possible and the optical length of each layer should be λ/4 or maximum reflectivity. The number of repeats increases the reflectivity and 10 to 20 pairs of layers should be sufficient for the device operation. In the specific device of FIG. 16, the bi-exciton emission occurs near 1.3 μm and the thickness of the above layers is chosen to enhance emission at this wavelength.

An optical cavity 309 is then formed overlying and in contact with the upper surface of the distributed Bragg reflector 303. The bottom of the cavity comprises an n doped GaAs cavity layer having a thickness of 34.4 nm 311. This layer is then followed by 156.5 nm layer of undoped GaAs at 313 that extends the total GaAs region i.e. n doped GaAs layer 311 and undoped GaAs layer to an optical thickness of λ/2. A self assembled quantum dot layer is grown by depositing a thin layer (approximately 1.5 to 4 nonolayers) of InAs. There is a large difference in the lattice parameters between InAs and GaAs. This results in the InAs forming quantum dots as it grows. Preferably the layer is grown to the equivalent of about 2 monolayers. A 190.9 nm thick undoped layer of GaAs is then formed overlying and in contact with the quantum dot layer. This layer is again chosen to be of a thickness of λ/2. This completes cavity structure 309.

A final undoped 70 nm Gas layer 319 is then formed overlying and in contact with the top layer 317 of the cavity region 319. A metal top layer comprising 50 nm of aluminium 321 is then formed overlying and in contact with GaAs layer 319. GaAs layer 319 is provided in order to phase match with the metal top layer. The metal top layer may be deposited on NiCr in order to add adhesion to the top of the structure. Hole 323 is then etched in the top of the metal layer and the hole extends through the whole of metal layer 321. The hole will be defined by a technique such as photo or electron beam lithography and may be wet edged or RIE etched.

In this structure, it is possible to bias metal contact layer 321 with respect to n doped substrate 301 via contacts (not shown). This means that it is possible to electrically fix the potential of the quantum dot conduction and valence bands with respect to the Fermi level of the device which will be to a large extent determined by the carrier concentration of the n doped layers underlying the cavity region 309.

The quantum dot is located within resonant cavity 309. The resonant cavity also acts as a wavelength filter. This is because the resonance condition $$\left(L_{cav} = \frac{m\lambda_{cav}}{2n_{cav}}\right)$$

is only satisfied for a narrow range of emission wavelengths. Thus, the wavelength of the cavity mode can be matched to the wavelength of the desired excitonic transition such as the biexciton or charged exciton transition. This will greatly suppress the collection of other exciton lines such as the simple neutral exciton line.

Thus, only these wavelengths are emitted into a narrow cone normal to the lower DBR 303 and upper mirror 321. The bandpass which can be thought of arising from the lifetime of the photon in the cavity, is largely determined by the reflectivity of the lower DBR 303 and upper mirror 321. Thus, increasing the reflectivities of these layers leads to a sharper cavity mode. The spectral bandpass of the cavity (or in other words, the width of the cavity mode) should ideally be designed to be roughly equal to the spectral width of the relevant exciton line of the emitting quantum dot.

The above example is formed in a GaAs substrate. It is also possible to form the device on a InP substrate. Taking FIG. 16, substrate 301 has a InP substrate. The lower distributed Bragg reflector 303 comprises alternate layers of 117.4 nm $AlAs_{0.5}Sb_{0.5}$ and 98.6 mn $Al_{0.1}Ga_{0.9}As_{0.5}Sb_{0.5}$. Again, this structure is n-doped. The cavity region 309 is constructed from an n-type $In_{0.52}Al_{0.48}$ As layer which is 0.18× thick, a 0.82× thick undoped $In_{0.52}Al_{0.48}$ As layer. A layer of InAs quantum dots 315 is then formed overlying and in contact with undoped layer 313. The upper part of the cavity comprises a 1.0× thick undoped $In_{0.52}Al_{0.48}As$ layer 317. A 0.73× thick $In_{0.52}Al_{0.48}As$ phase matching layer 319 is then formed overlying and in contact with upper cavity layer 317 where x is calculated from $$x = \frac{\lambda}{2n_{cav}} \text{ for } \lambda \equiv 1.55 \ \mu m.$$

Figure 17:
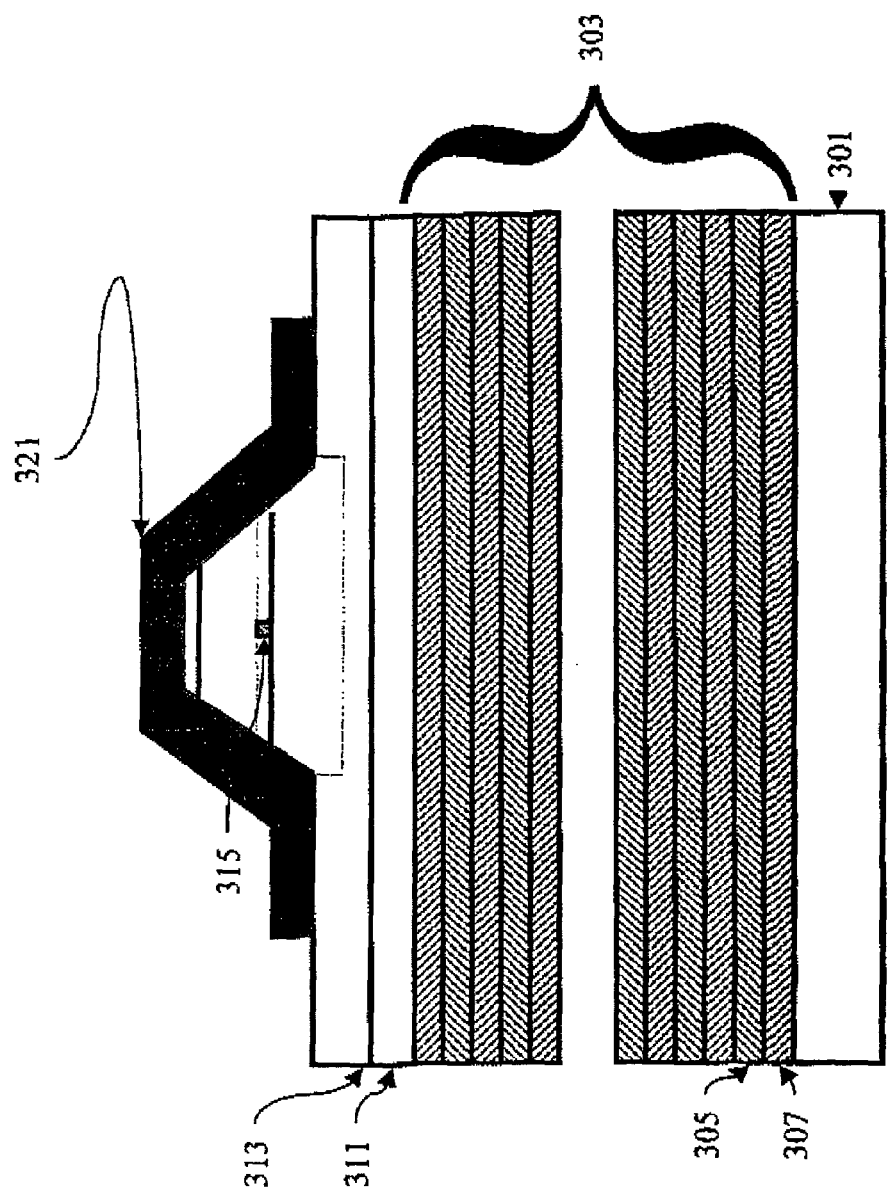
FIG. 17 illustrates a single photon emitter in accordance with a preferred embodiment of the present invention.

FIG. 17 illustrates a variation on the structure of FIG. 16. To avoid unnecessary repetition, like reference numerals are used to denote like features.

The processing of the device of FIG. 17 is identical to that of FIG. 16 up to the formation of phase matched GaAs layer 319. Once this layer has been formed, mesas are etched into the structure by photo lithography followed by wet etching. The mesas have a diameter in the region of 0.2 to 10 µm. The etch is allowed to proceed into GaAs layers 311 and 313. The etch does not proceed into the distributed Bragg reflector 303. After etching, 50 mn of aluminium is evaporated over the pillar so that it is completely covered. This allows a top electrical contact to be made.

Figure 18:
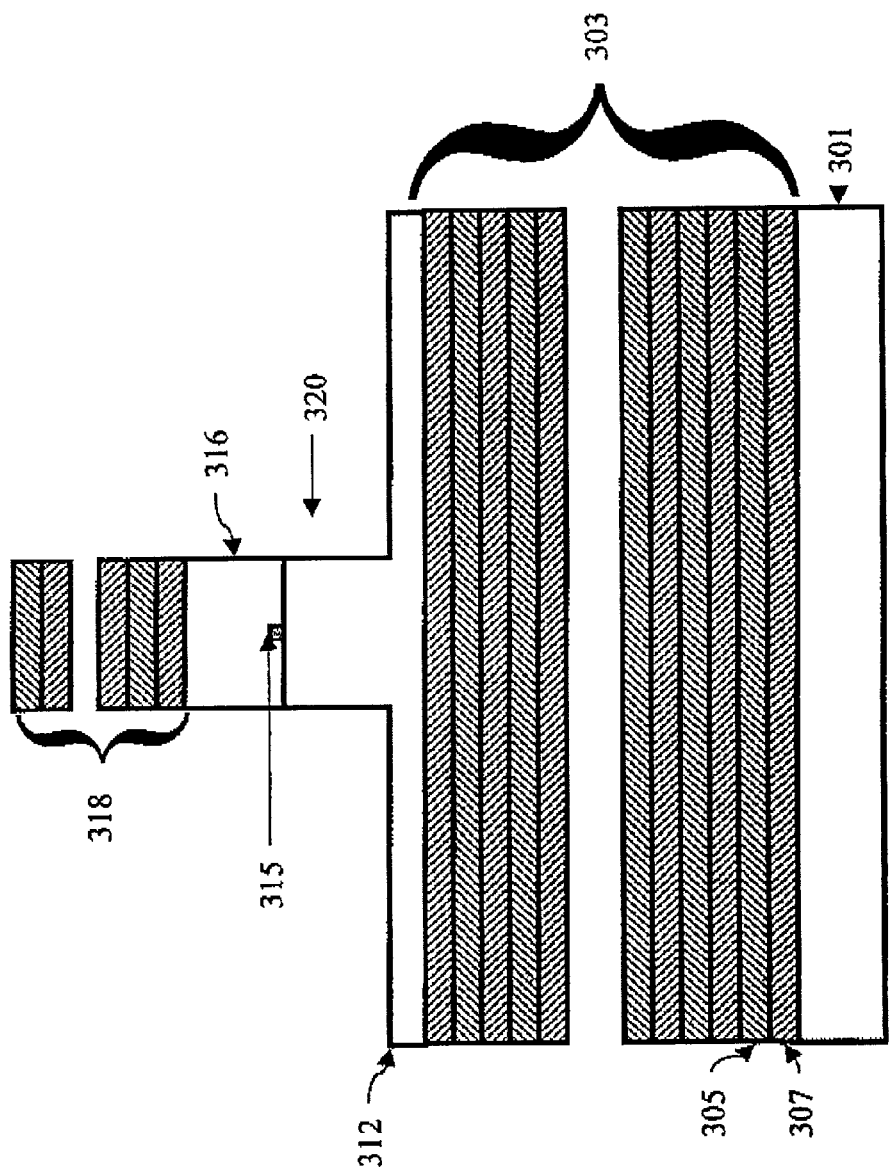
FIG. 18 illustrates a single photon emitter in accordance with another preferred embodiment of the present invention.

The structure of FIG. 18 is a pillar p-i-n structure. Essentially the cavity is the insulating region and the upper and lower distributed Bragg reflectors are p and n doped respectively. The lower distributed Bragg reflector 303 is identical to that described with reference to FIG. 16. To avoid unnecessary repetition, like reference numerals will be used to denote like features.

A first layer of 190.9 nm of undoped GaAs 312 is then formed overlying and in contact with the upper surface of lower reflector 303. InAs quantum dot 315 is then formed by depositing a few monolayers of InAs. Upper cavity layer 316 comprising 190.9 nm of undoped GaAs is then formed overlying and in contact with lower cavity layer 312 and dot 315.

A second distributed Bragg reflector 318 is then formed overlying and in contact with the upper surface of the cavity 309. The upper distributed Bragg reflector 318 is formed in an identical manner to that of the lower distributed Bragg reflector 303. However, the upper Bragg reflector is p type doped whereas the lower Bragg reflector is n type doped, and should have fewer repeats to match the reflectivity of the bottom distributed Bragg reflector.

Pillar 320 is then defined by etching through the upper distributed Bragg reflector 318 and through most of the cavity 309 and into layer 312. This is achieved by defining the pillar using photo lithography and etching using reactive ion etching, The etch should be taken as close as possible to the bottom of the distributed Bragg reflector 303. The mesa has a diameter in the range 0.2 to 10 µm.

Metal is then evaporated onto the top surface so that an ohmic electrical contact can be made with some part of the p type top distributed Bragg reflector 318 and an ohm electrical contact (not shown) is made to n-type layer 301.

The dimensions of the cavity 309 are important as they define the energy of the cavity mode for the device. The cavity mode energy allows photons with the same energy to escape from the device. For example, if the neutral bi-exciton is the preferred emission then it is necessary for the cavity mode to correspond to the bi-exciton emission.

Figure 19:
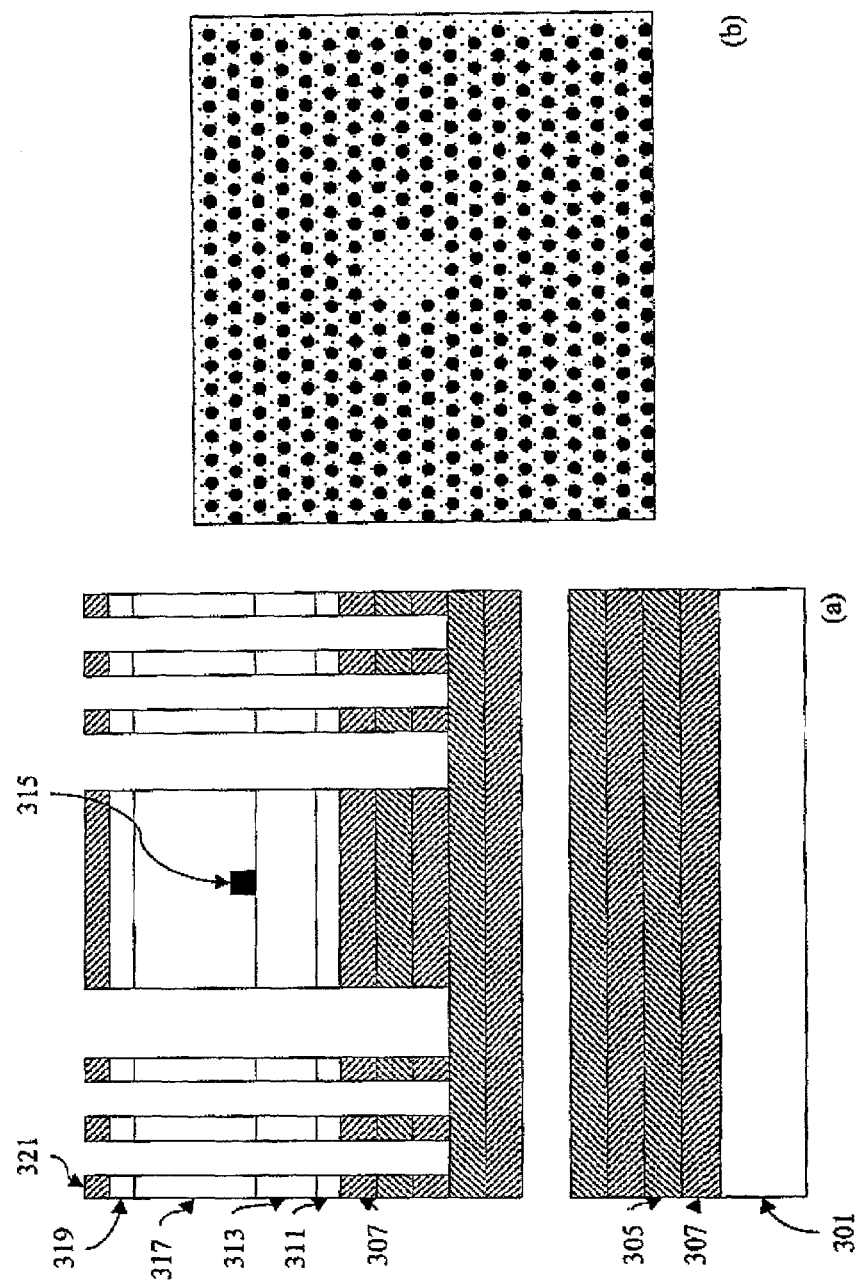
FIG. 19 illustrates a photon source in accordance with a further embodiment of the present invention where light emitted from the photon source is confined using a photonic band gap structure.

FIG. 19 shows a photonic bandgap structure. Here, the device of FIG. 16 is taken and the device is fabricated up to the top contact layer 321.

A series of holes is then etched down through the structure into the distributed Bragg reflector 303. A plan view of the whole arrangement is shown in FIG. 19b.

The holes are etched using reactive ion beam etching which could define deep holes which can extend up to a micron, or preferably move into the semiconductor. Missing holes in the centre of the pattern define the cavity in the third dimension. About 1–7 holes are suggested for this example. This array of holes acts as a two dimensional distributed Bragg reflector with air acting as the material with the low reactive index. This creates an optical cavity surrounding the quantum dot confined by a metal top mirror, a DBR and an in-plane photonic crystal lattice.

Again, it is important to define the energy of the cavity mode and to equate that to the energy of the desired exciton emission. For example, the bi-exciton emission. Typically, the whole spacing will be from 300 to 700 nm with a hole diameter from 100 to 500 nm.

Figure 20:
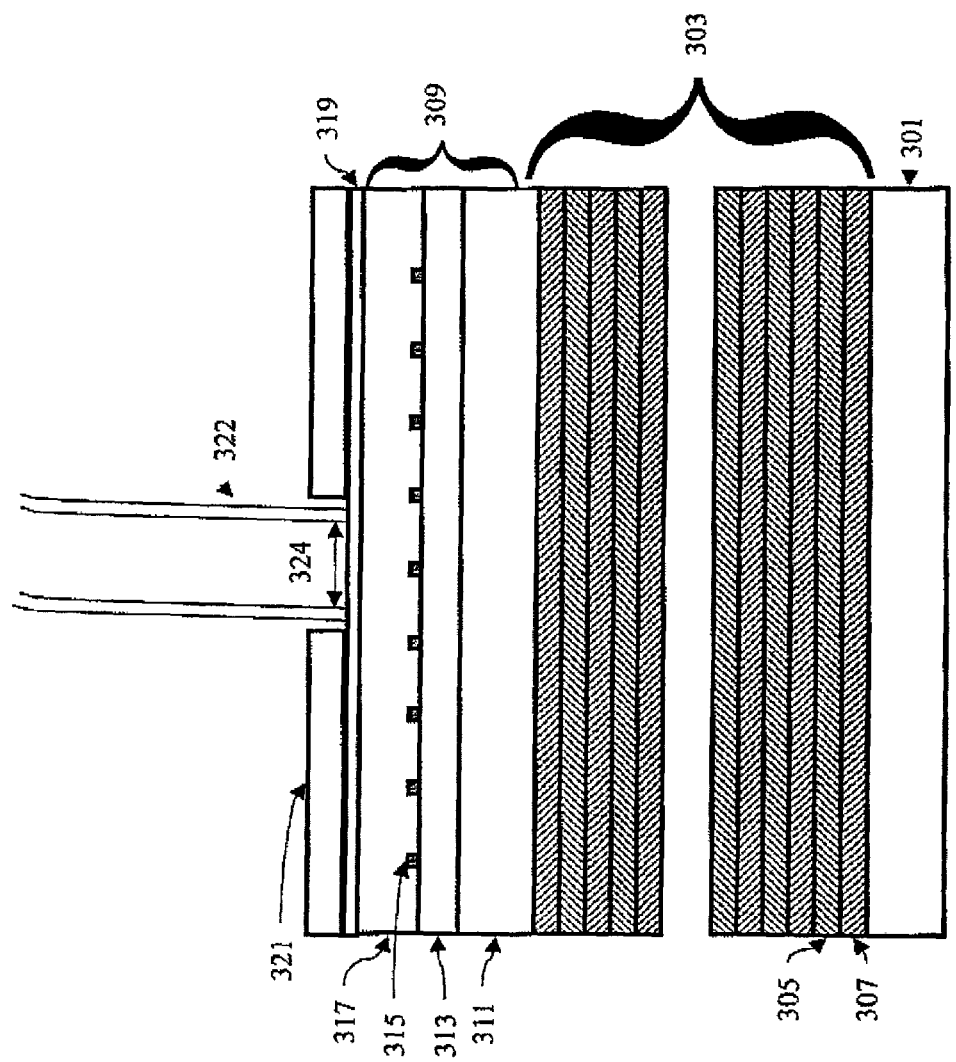
FIG. 20 illustrates a single photon emitter according to an embodiment of the present invention coupled to an optical fibre.

FIG. 20 illustrates schematically a photon source of the type described with reference to FIG. 16 connected to a fibre optic cable.

The fibre optic 322 is positioned so that its core 324 is located so that it overlays one quantum dot. Hence, the emission from one quantum dot is collected by the fibre. The optical fibre also has a relatively high numerical aperture to collect as much of the emitted light as possible.

Other optical components such as a microscope objective lens may also be used. The elements of the objective may be coated for maximum transmission of the desired emission wavelength of the quantum dot.

The above examples have mainly concentrated on photon sources comprising a single quantum dot. However, it is often desirable to form a multi-dot device of the type illustrated in FIG. 21.

Figure 21:
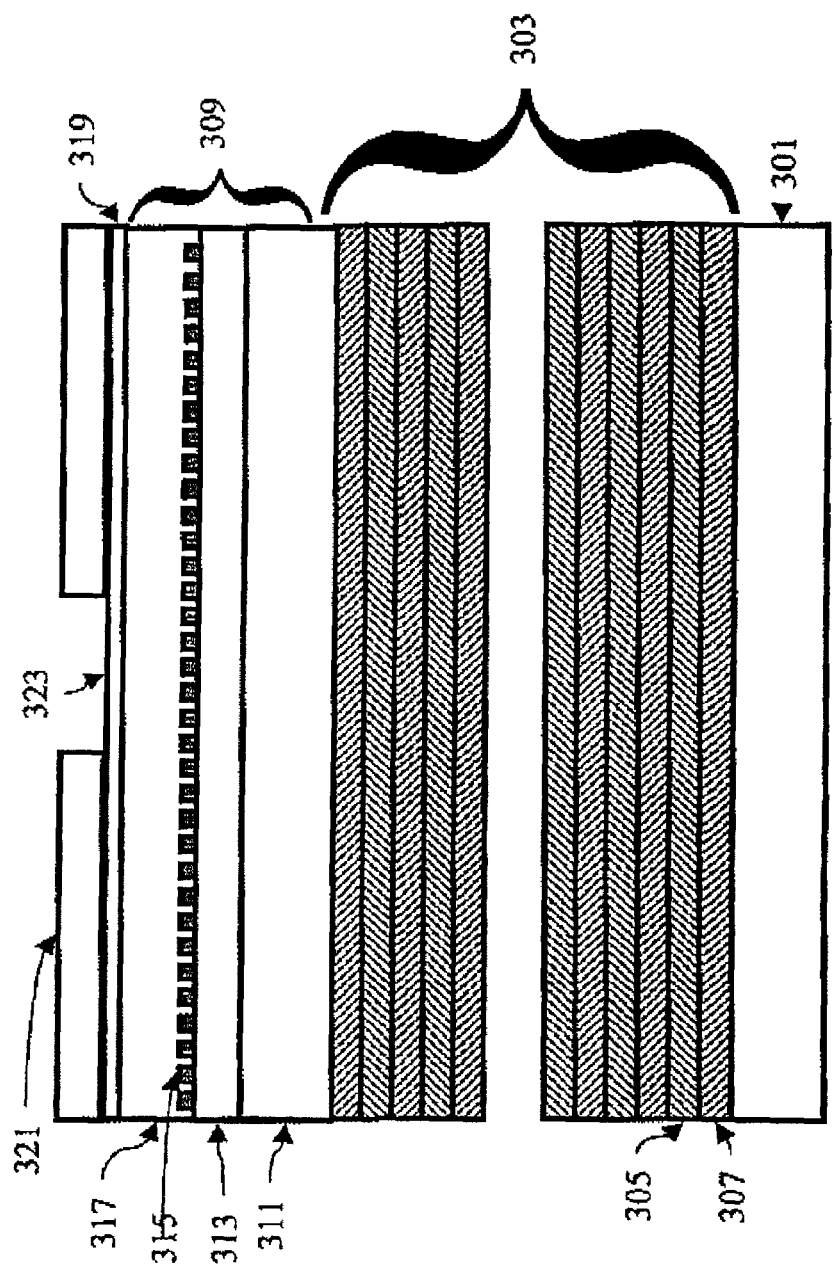
FIG. 21 illustrates a single photon emitter having a plurality of quantum dots in accordance with an embodiment of the present invention.

FIG. 21 shows a photon source where photons emitted from a plurality of quantum dots. Except for the density of the quantum dot layer the structure is similar to that of FIG. 16. Therefore, to avoid unnecessary repetition like features are denoted by the same reference numerals.

In this type of structure, the emission from a large number of quantum dots (1 to 1000) can be collected. However, in this case, it is possible to extract the emission from a single quantum dot by spectrally filtering the emitted light. Spectral filtering also selects a particular transition within the quantum dot as previously described.

As described with reference to FIG. 16, the quantum dots are located within a resonant cavity 309. The resonant cavity will also act as a wavelength filter. This is because the resonance condition $$\left(L_{cav} = \frac{m\lambda_{cav}}{2n_{cav}}\right)$$

is only satisfied for a narrow range of emission wavelengths. Thus, the wavelength of the cavity mode can be matched to the wavelength of the desired excitonic transition such as the biexciton or charged exciton transition. This will greatly suppress the collection of other exciton lines such as the simple neutral exciton line.

Thus, only these wavelets are emitted into a narrow cone normal to the lower DBR 303 and upper mirror 321. The bandeaus which can be thought of arising from the lifetime of the photon in the cavity, is largely determined by the reflectivity of the lower DBR 303 and upper mirror 321. Thus, increasing the reflectivities of these layers leads to a sharper cavity mode. The spectral bandpass of the cavity (or in other words, the width of the cavity mode) should ideally be designed to be roughly equal to the spectral width of the relevant exciton line of the emitting quantum dot.

Figure 22:
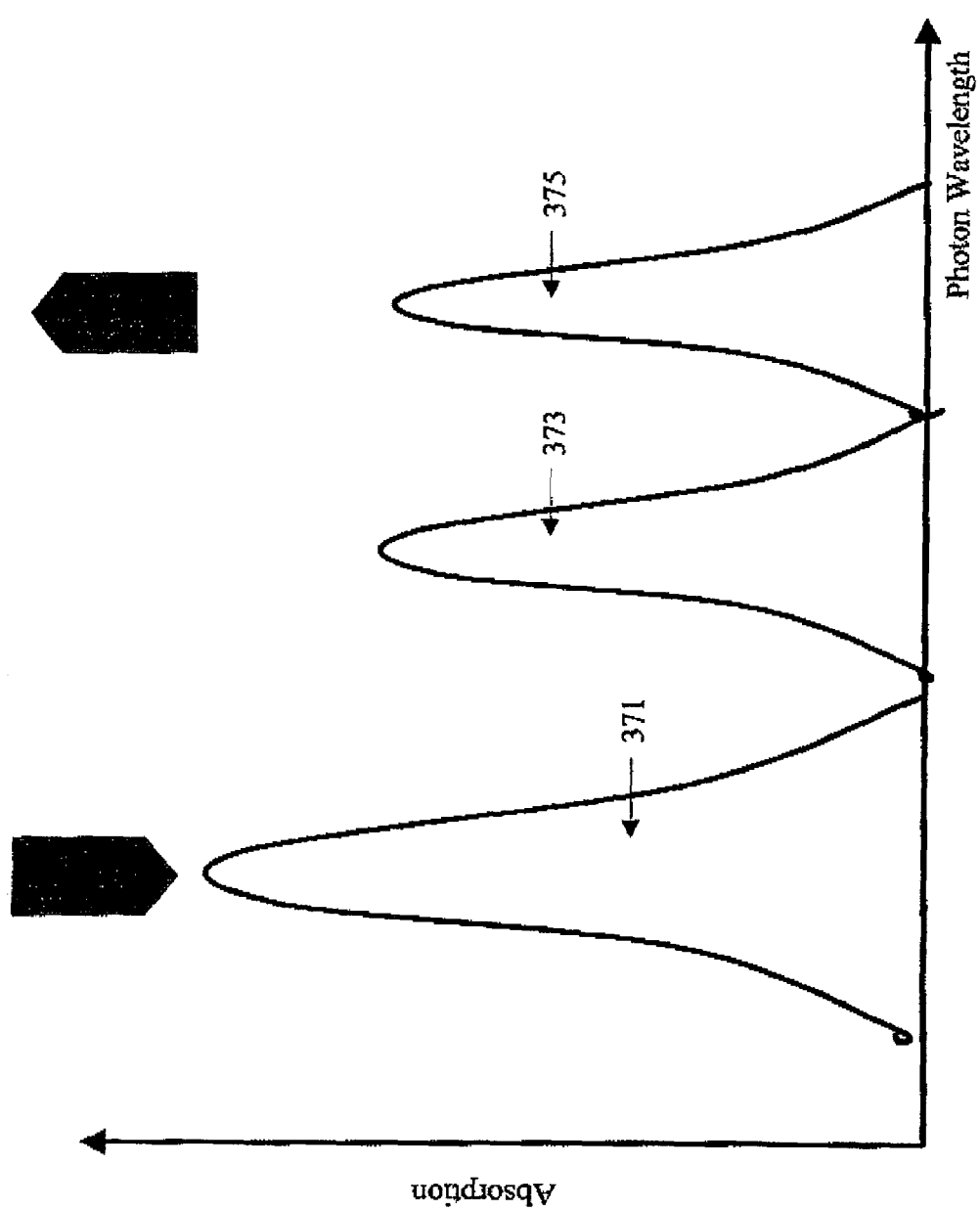
FIG. 22 illustrates a schematic absorption spectra of the embodiment of FIG. 21.

FIG. 22 shows a schematic optical absorption spectrum of the plurality of quantum dots shown in FIG. 21. Absorption of the quantum dot is plotted along the y-axis (arbitrary units) photon wavelength of the emitted photons are plotted along the x-axis (arbitrary units). The optical spectrum of each quantum dot consists of a series of sharp lines whose width are determined by the homogenous broadening due to the finite lifetime. However, because of unavoidable fluctuations in the size and composition of the dots in a plurality of dots, the transition energies vary from dot to dot. Thus, the three absorption peaks 371, 373, and 375 are inhomogenously broadened.

Figure 23:
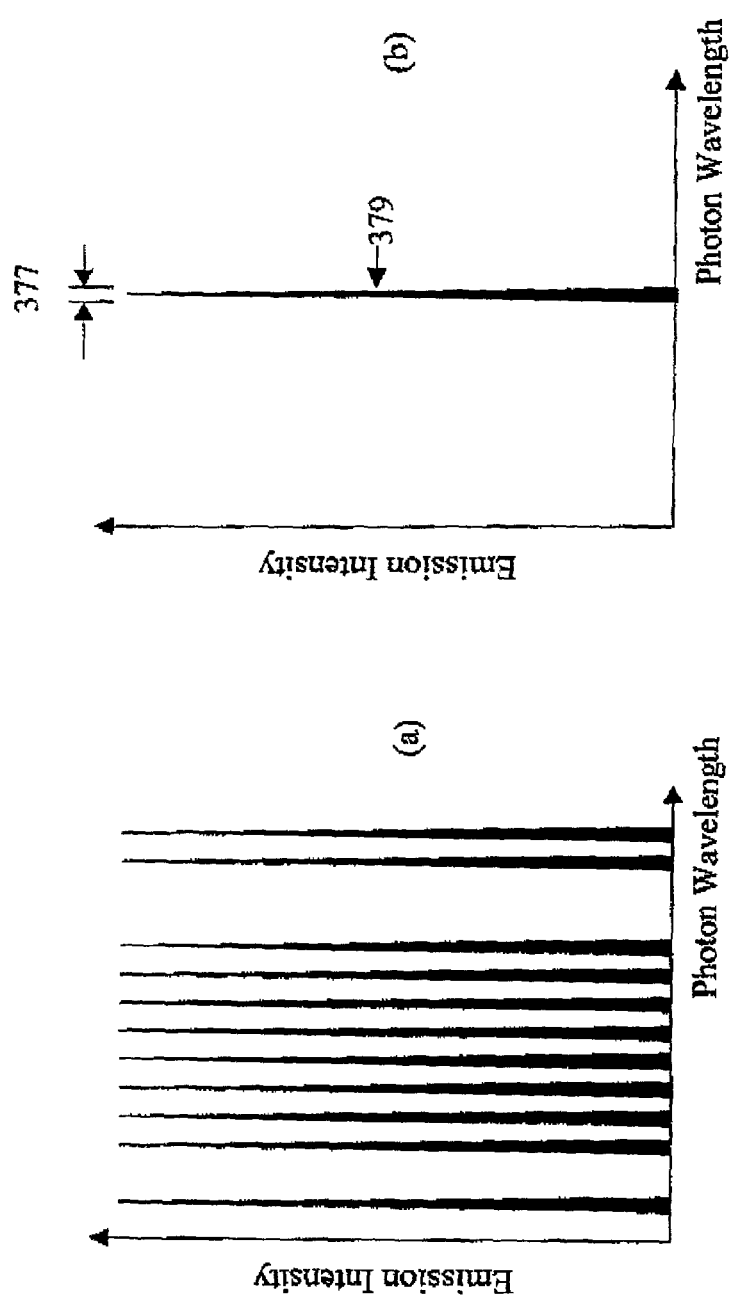
FIG. 23 illustrates a wavelength filter for filtering the wavelength of the embodiment of FIG. 21.

If the quantum dots are excited by a laser with a broad wavelength spectrum, a large number of quantum dots will be expected in the active region. However, because each of these emits a different wavelength, it is possible to filter the collected light in order to see the emission from a single dot. This is shown schematically in FIGS. 23a and 23b. FIG. 23b shows a plot of emission intensity on the y-axis (arbitrary units) and photon wavelength on the x-axis (arbitrary units). Each of the plurality of spikes is due to emission from a particular transition within a single quantum dot. FIG. 23b shows the results where filter 377 has filtered all but one of the photon wavelengths 379. Therefore, using pulsed excitation, it is possible to generate period emission of a single or multiple photons from a dot in a similar way to that described above. Preferably, the emitting area of the sample from which light is collected should contain a limited (<1000) number of optically active quantum dots. In this case, the spectral filter selects the quantum dot as well as a particular transition within the dot.

Figure 24:
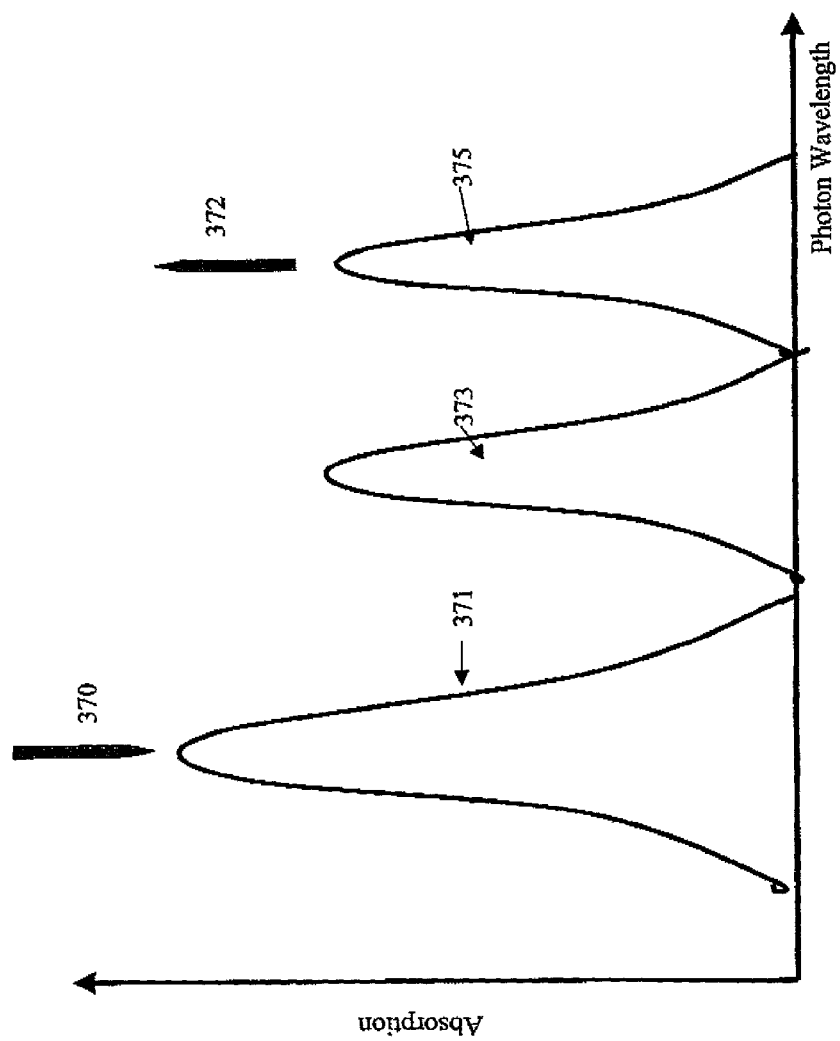
FIG. 24 illustrates an absorption spectra for a single photon emitter having a plurality of quantum dots with wavelength filtration.

Alternatively, a spectrally narrow laser may be used to excite a transition in just or a few quantum dots. Such a configuration is illustrated with reference to FIG. 24. FIG. 24 shows an optical absorption spectrum similar to that of FIG. 22. Peaks 371, 373 and 375 are due to excitation of different quantum dot transitions. The incident laser wavelength 370 is much narrower here than the laser wavelength described with reference to FIG. 22. Hence, the laser excites only a fraction of the quantum dot plurality: those with a transition energy equal to the laser energy. Hence, it can be seen that the emitted wavelength 372 is also much narrower than the emitted wavelength (before filtering) of the spectrum shown in FIG. 22. A laser of sufficiently narrow wavelength spectrum will excite just one of the quantum dots. Preferably, the emitting area of the sample from which light is collected should contain a limited (<1000) number of optically active quantum dots.

It is also possible to collect two photons from the source and use both of these photons. For example, a photon which arises from the bi-exciton emission and a photon which arises from the resulting simple exciton emission may be used.

It has been found that using an anti-symmetric dot, the non-degenerate exciton energy levels mean that during bi-exciton decay, two photons are emitted which have the same linear polarisation. Further, the polarisation of photons emitted from a particular dot as the result of separate exciton excitations will randomly switch between two polarisation states in the same polarisation basis. Thus, the quantum dot itself can be used to randomly send bits of one or zero depending on which polarisation state within the dot's polarisation basis is selected by the dot.

Since during bi-exciton decay, the dot will emit two photons having different energies but which will always have the same polarisation state, one of these photons can be measured in order to determine the polarisation state sent by the dot whereas the other photon can be sent to a remote receiver.

Figure 25:
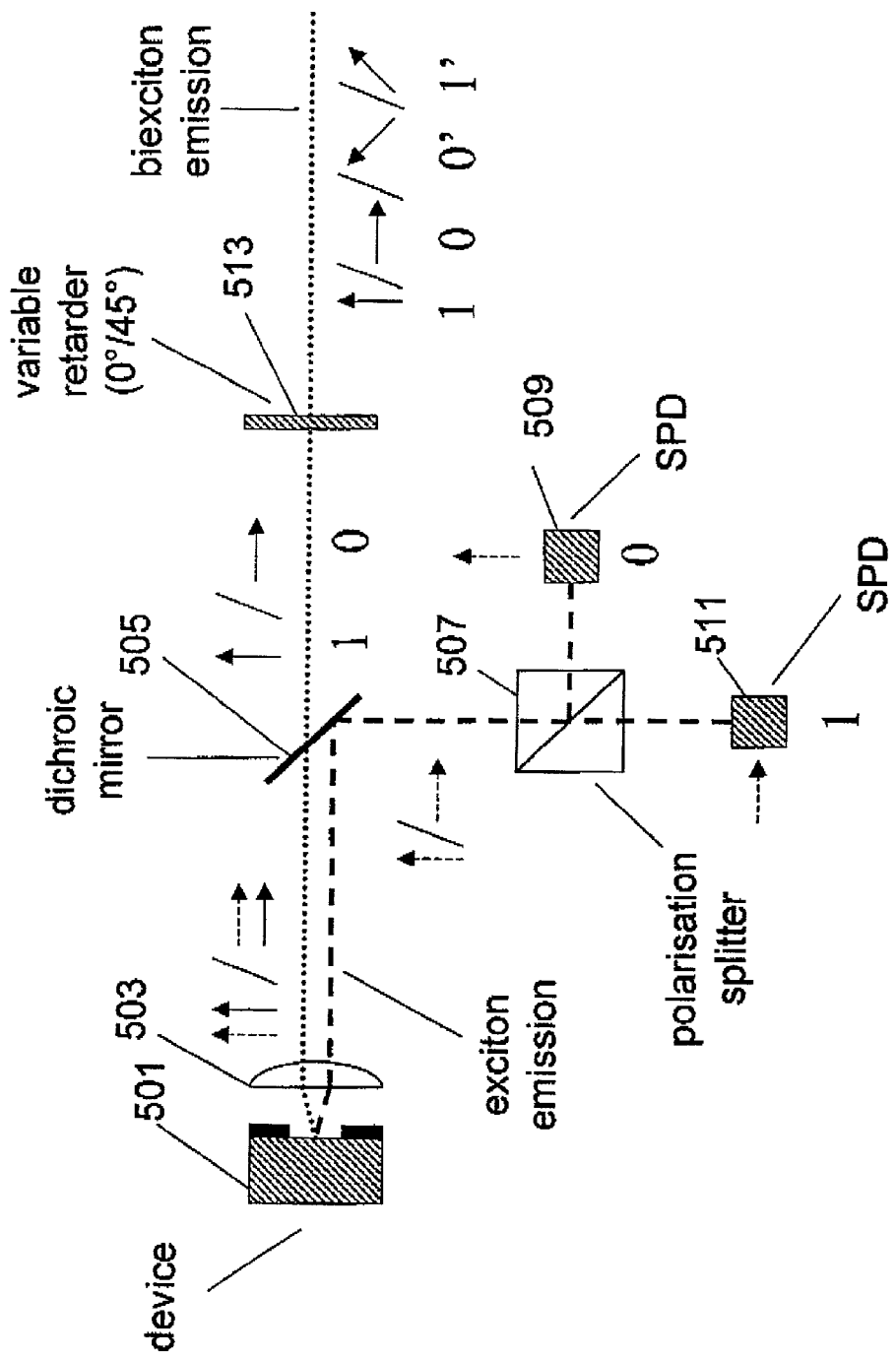
FIG. 25 illustrates a photon source in accordance with a further embodiment of the present invention configured for use with a BB84 protocol.

FIG. 25 illustrates a source configured for use with the BB84 communication protocol. The BB84 communication protocol is described in BB84 (Bennett et al. Proceedings of the IEEE International Conference on Computers, Systems and Signal Processing, Bangalore, India (IEEE, New York 1984) p 175). The protocol will not be discussed in detail here. However, it is necessary to send photons to a receiver randomly having one of two possible orthogonal polarisation states in one of two non-orthogonal basis.

The source is shown in detail in FIG. 25. The source comprises a photon emitter 501 which may be a photon source as previously described with reference to any of FIGS. 9 to 21. The photon source is configured to excite at least a bi-exciton within the quantum dot and then to allow emission of both the photon which arises from bi-exciton decay to the simple exciton state, and the emission of the photon which arises from the further decay of the simple exciton to the ground state.

The two photons will be emitted from the single photon source 501 and collimated by lens 503 onto dichroic mirror 505. Dichroic mirror 505 reflects photons of a particular energy and transits photons having a different energy. The dichroic mirror may be configured to reflect photons from the single exciton decay and transmit photons from the biexciton decay. However, as will be appreciated by those skilled in the art, the dichroic mirror may be configured in the alternate configuration. However, we expect that it may be advantageous to reflect the exciton photon and transmit the biexciton, as the signal to noise level in the more highly attenuated transmission channel would benefit more greatly from the reduced dark counts that can be achieved with the biexciton photons, as they generally have less jitter, allowing the detector to be gated off for longer.

The single exciton photon and the bi-exciton photon will be emitted at different times. Presuming that the single exciton photon is reflected by dichroic mirror 505, the single exciton photon is then directed into polarising beam splitter 507. Polarising beam splitter is configured to measure the polarisation of the single exciton photon using the known polarisation basis of the photons emitted by the device. The polarisation basis of this photon is known because the device will only emit photons having a certain polarisation basis. In this particular example, the components of the polarisation basis are defined by the vertical polarisation direction, and the horizontal polarisation direction. These axes are known to align with the [110] and [1$\bar{1}$0] directions of the plane of the GaAs substrate. Photons having a vertical polarisation axis are reflected by polarising beam splitter into single photon detector 509, photons having an horizontal polarisation are detected by single photon detector 511.

Photons arising from the biexciton decay are transmitted by dichroic mirror 505 and then impinge on variable retarder 513. Variable retarder 513 randomly switches the polarisation of the detected photon by either 0° or 45°. This serves to rotate the polarisation basis of some photons through 45°. The user of the photon source shown in FIG. 25 knows the basis of the single photons which pass through variable retarder 513 because the user will either control the variable retarder or be able to determine the rotation angle used by the retarder. The user of the source also knows whether the photons which pass through the variable retarder have initially a vertical or horizontal polarisation since the user has measured the simple exciton photon polarisation state which should be identical to that of the biexciton polarisation state. Thus, the user can operate this source in accordance with the BB84 protocol.

Figure 26:
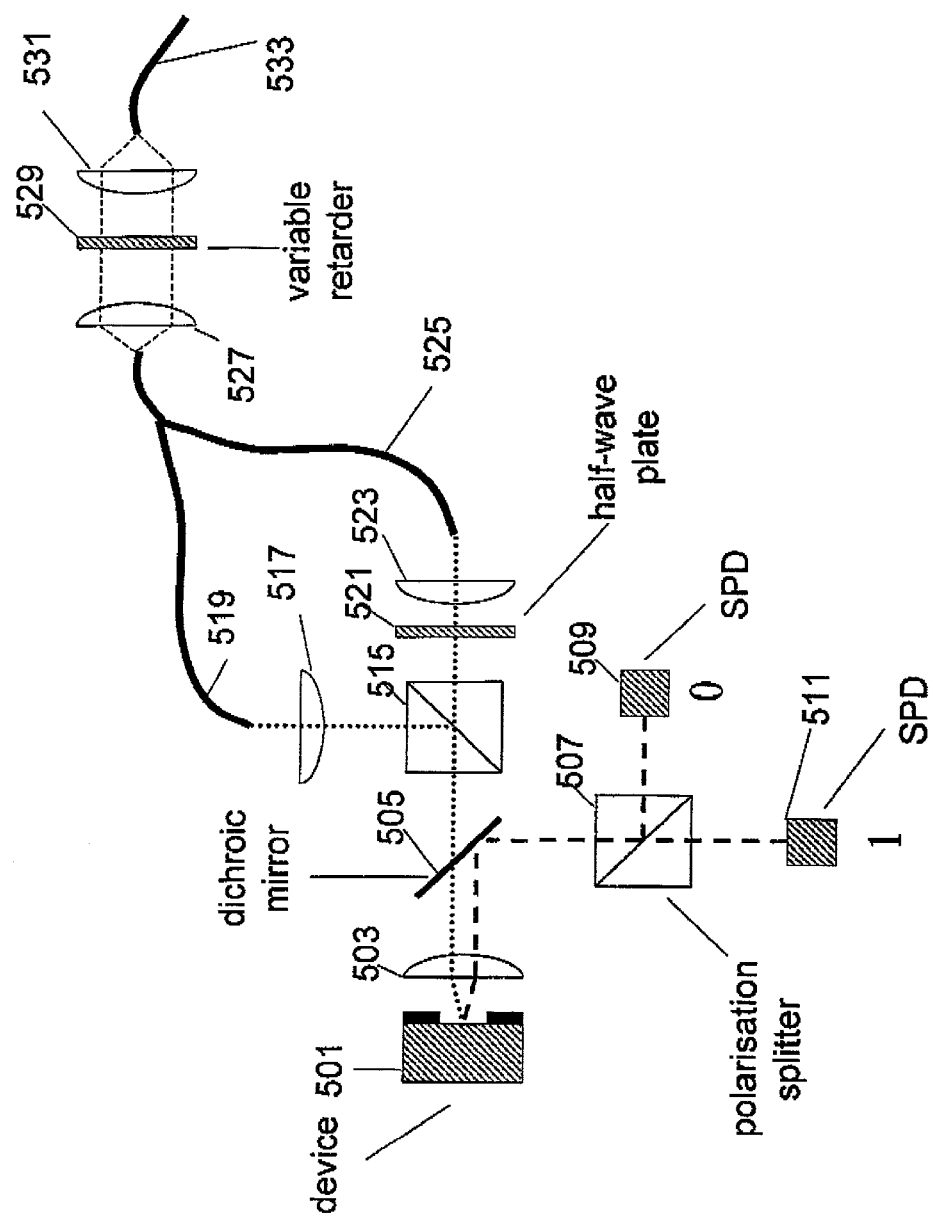
FIG. 26 illustrates a further arrangement of the photon source of FIG. 25.

FIG. 26 illustrates a variation on the source of FIG. 25. To avoid unnecessary repetition, like reference numerals will be used to denote like features. The bi-exciton photon and the simple exciton photon are separated as described in FIG. 25. Further, the polarisation state of the simple exciton is also measured with reference to FIG. 25.

In the BB84 protocol, there are two random variables, one is the polarisation which switches between two non-orthogonal basis and the other is the state occupied in those two basis. In the example of FIG. 25, the inherent randomness of the source was used in order to randomly switch between states in a basis. The user applied an external random number generator in order to vary the basis between 0° and 45°.

In FIG. 26, the source itself is used to provide randomness in the basis state whereas the user introduces the random switching between states in a basis using a variable retarder.

A polarising beam splitter 515 is used to direct photons having one polarisation state into lens 517 which in turn sends the photons into fibre 519. Other photons having the other orthogonal polarisation state are transmitted by polarising beam splitter 515 through half waveplate 521. Half waveplate 521 rotates the polarisation of the photons through 45°. Thus, the photons which pass through half waveplate 521 have a different basis to the photons which are transmitted into first fibre optic cable 519.

The photons which emerge from half waveplate 521 are then focussed by lens 523 into second fibre optic cable 525. The output of both fibre optic cables is then collected by lens 527 which focuses both photons from first fibre optic cable 519 and second fibre optic cable 525 onto variable retarder 529.

Variable retarder 529 is configured to either add 0° polarisation rotation or 90° polarisation rotation to a photon passing therethrough. Thus, the variable retarder changes the polarisation state between two orthogonal states within the same polarisation basis. The output from the variable retarder is then collected by lens 531 and directed into output cable 533. We note that for an implementation of a variable retarder that is based on varying the angle of the fast axis of a half-wave plate, one position will result in the rotation of the polarisation of a rectilinearly polarised photon by 90°, and of a diagonally polarised photon by 0°, and the other position will result in the rotation of rectilinear polarised photons by 0°, and of diagonally polarised photons by 90°. This does not cause any problems in the systems described, the actual polarisation, and therefore the quantum bit information, of the transmitted photon will always be known.

Figure 27:
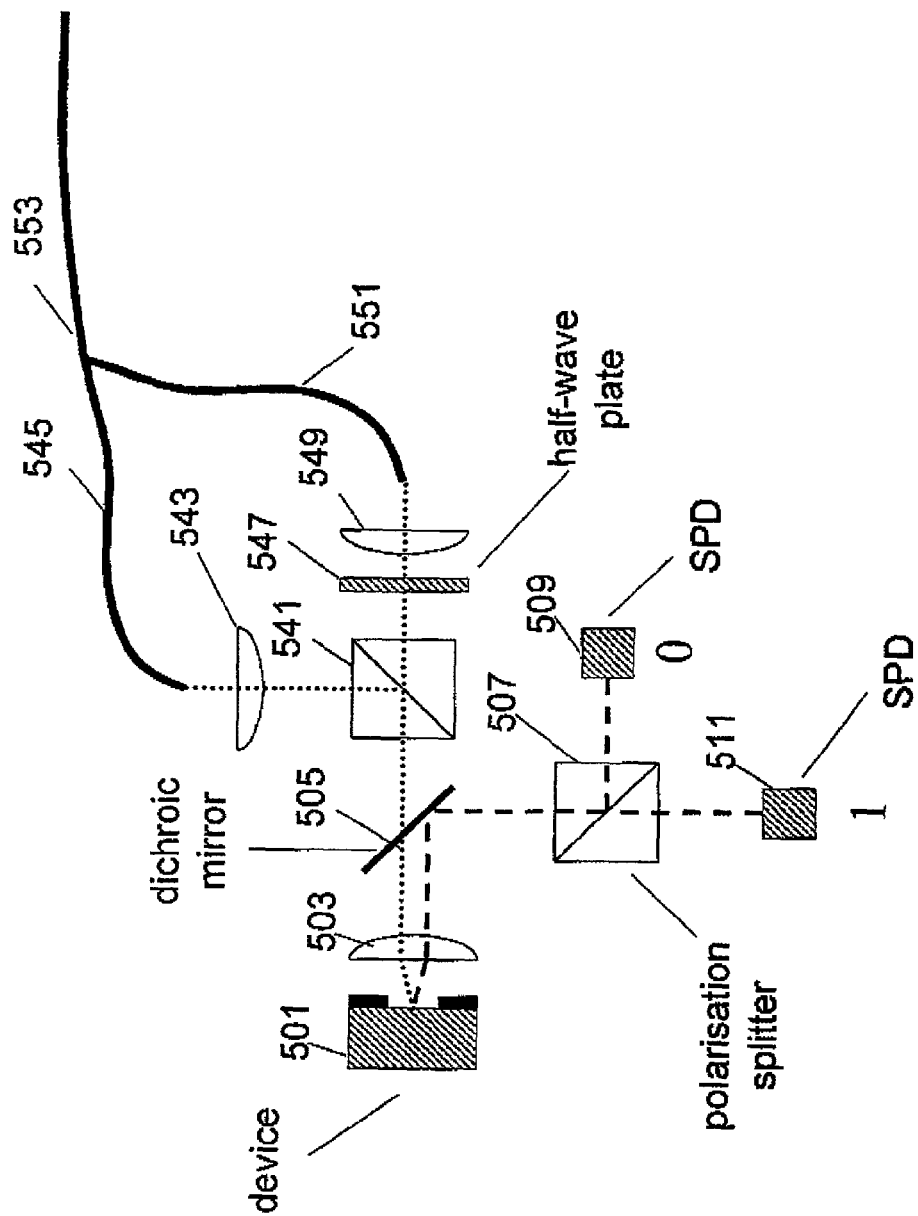
FIG. 27 illustrates a photon source in accordance with a preferred embodiment of the present invention configured to use the B92 protocol.

The above two sources have been configured for use with a BB84 protocol. FIG. 27 illustrates a source suitable for use with the B92 protocol. In the B92 protocol, photons are transmitted from a sender to a receiver in one of two non-orthogonal basis. The polarisation state is not varied in each basis. Details of the B92 protocol can be found in Bennett, Phys Rev. Lett, 68 3121 (1992).

To avoid unnecessary repetition, like reference numerals will be used to denote like features with that of the sources of FIGS. 25 and 26. In the same manner as the BB84 sources, the single simple exciton photon and the bi-exciton photon are separated by a dichroic mirror 505. The polarisation of the simple exciton is then determined using polarising beam splitter 507 which outputs to either single photon detector 509 or single photon detector 511 depending on the polarisation state of the detected photon. The photons from the biexciton decay are then directed by polarising beam splitter 541 depending on their polarisation.

Photons having one state of the polarisation basis are directed by polarising beam splitter 541 into lens 543 which in turn directs these photons into first fibre optic cable 545. Photons which are emitted from the photon source 501 having the other polarisation state in the orthogonal basis cannot be used for the B92 protocol in their current form. Therefore, their basis is rotated by half waveplate 547. This means that the polarisation state of these photons is now in a different non-orthogonal basis to that of the photons in the first fibre optic cable. Further, both sets of photons only occupy one state in either basis. The photons which pass through half waveplate 547 are then focussed by lens 549 into second fibre optic cable 551. This cable is then combined with first fibre optic cable 545 to form output cable 553. Preferably the lengths of the two paths of differently polarised photons from the polarising beam splitter 541 to optic fibre 553 should be equal.

Figure 28:
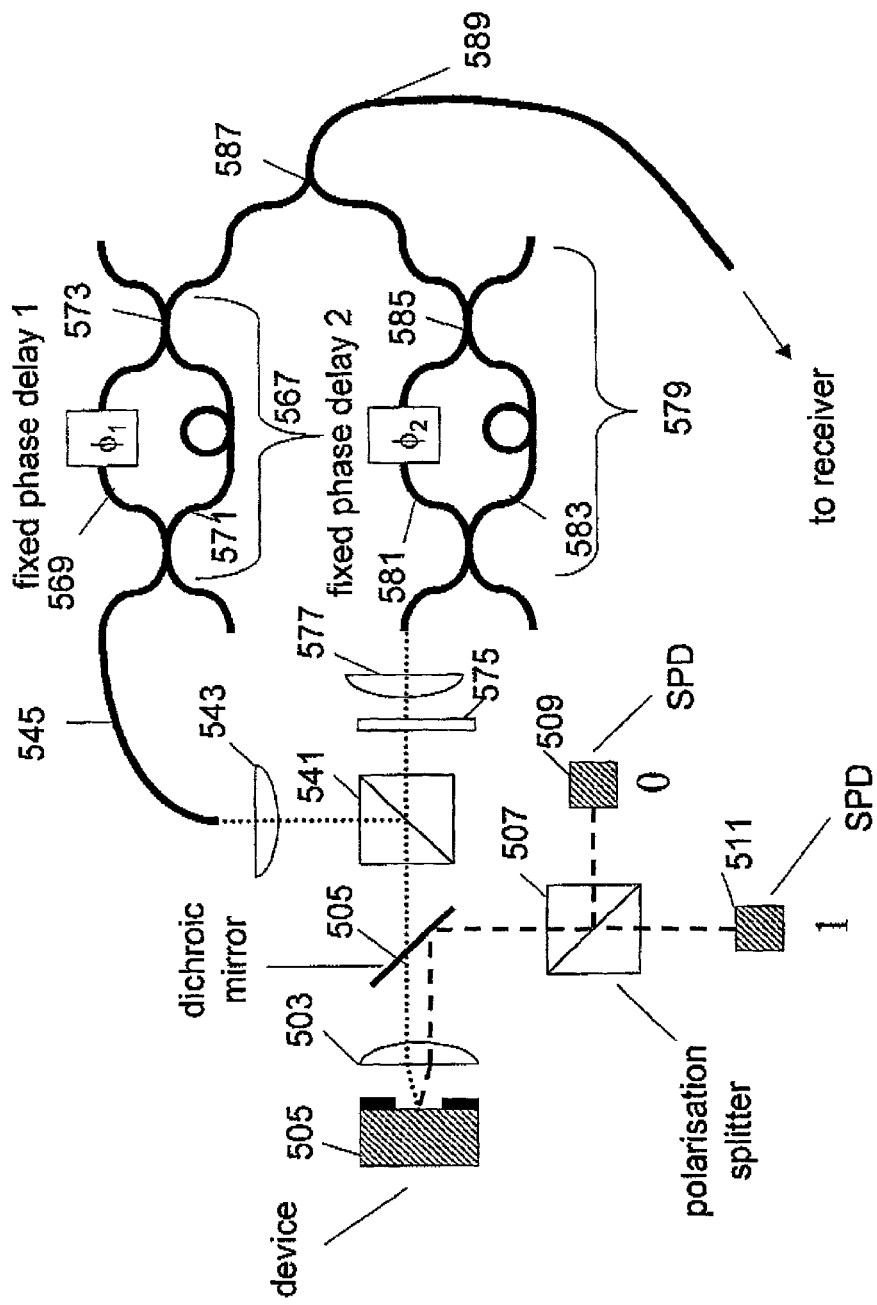
FIG. 28 illustrates a photon source in accordance with a preferred embodiment of the present invention configured to use phase encoding and the B92 protocol.

FIG. 28 shows a further variation on the B92 protocol. Here, the photons are emitted having one state selected from one of two non-orthogonal phase states.

In FIG. 28, the bi-exciton photon and a simple exciton photon are emitted from source 505 and are split in the same manner with a dichroic mirror as described with reference to each of the sources in FIGS. 25 to 27. The single exciton photon is sent to be measured by polarising beam splitter 507 and single photon detectors 509 and 511 as described with reference to FIG. 25. The path of a biexciton photon is then selected by polarising beam splitter 541 which directs photons having one polarisation state of the basis state into lens 543 which in turn directs the photons into first fibre optic cable 545. These photons are then directed into interferometer arrangement 567. Interferometer arrangement 567 comprises two paths, upper path 569 and lower path 571. Upper path introduces a phase delay $\Phi_1$ into the path of the photon. Due to the wave like nature of the photon, when it enters an interferometer, it is believed to pass through both paths at the same time and interfere with itself when it emerges at fibre optic coupler 573.

Photons occupying the other polarisation state are passed through polarising beam splitter 541. Then, their polarisation is rotated through 90° by retarder 575 which means that these photons now have exactly the same polarisation basis and polarisation state of the photon which were directed into first fibre optic cable 545. These photons are then collected by lens 577 and directed into second interferometer arrangement 579. Second interferometer arrangement has an upper path 581 and a lower path 583. A phase change of $\phi_2$ is introduced into the upper path. In the same manner as described with reference to the first interferometer, photons entering this interferometer are interfered with themselves and emerge with a phase $\phi_2$ at fibre optic coupler 585. The output from both first interferometer 567 and second interferometer 579 are coupled at output beam coupler 587 and the output is directed into output fibre 589.

The phase delay $\phi_1$ and $\phi_2$ are chosen so that the photons emerging from both the first interferometer 567 and the second interferometer 569 have one of two non-orthogonal phases. The phase is chosen at random since it is selected on the basis of the polarisation state which is outputted by the source 505. Preferably, the phase difference between $\phi_1$ and $\phi_2$ should be equal to 90°.

Figure 29:
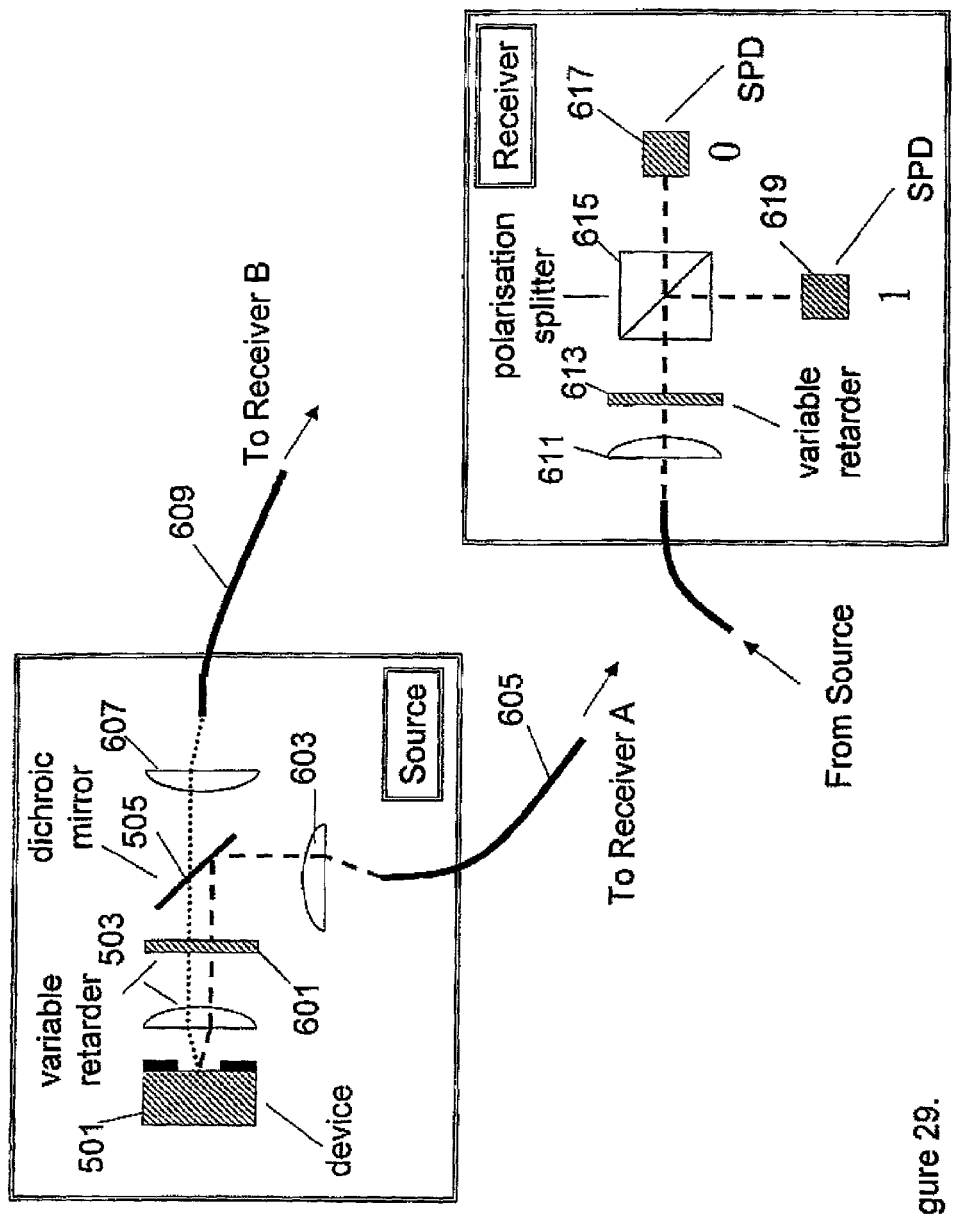
FIG. 29 illustrates a quantum communication system in accordance with a preferred embodiment of the present invention.

FIG. 29 illustrates a quantum communication system. Previously, it has been proposed to use both the B92 protocol and the BB84 protocol with entangled photon pairs. In such arrangements, a single source is used to send the message and two receivers read the message. With entangled photon pairs, when receiver A tries to read the entangled state of the photon which may be the polarisation, phase, energy etc, the measurement of this state affects the photon which is being sent to receiver B.

The apparatus of FIG. 29 does not use entangled photon pairs. However, it uses a source which sends information to two receivers. The source is similar to that described with reference to FIG. 25.

A device 501 is configured to emit a first photon arising from radiative bi-exciton decay and a second photon due to the subsequent radiative decay of the simple exciton. These two photons are focussed by lens 503 onto variable retarder 601. Variable retarder 601 introduces a 0° or 45° variable rotation of the polarisation direction of the photons. The same rotation is added to both photons emitting from the bi-exciton decay and the associated simple exciton decay. Although, it should be appreciated that both photons will reach the retarder at different times, so the system must be configured so that the retarder remains in the same position for both photons. These photons are then separated using dichroic mirror 505 in the same manner as described with reference to FIG. 25.

One of the photons, say for example the photon arising from the bi-exciton transition is then collected by lens 603 and directed to receiver A along fibre 605. The other photon, say for example, the simple exciton photon is collected by lens 607 and directed into second fibre 609 which carries the photon to receiver B. The photon emitted down first fibre optic cable 605 and the associated photon emitted by second fibre optic cable 609 have the same polarisation basis and polarisation state within that basis. The polarisation basis being set by variable retarder 601. The polarisation a being set by the actual photon source 501.

The receiver is fairly simple in construction. As both receivers are identical, only one will be described. Photons enter the receiver via either the first fibre optic cable 605 or the second fibre optic cable 609. The photons are then collected by lens 611 and then directed onto variable retarder 613. Variable retarder 613 allows the polarisation to be rotated by either 0° or 45°. This sets the measuring basis for the polarisation splitter 615. If the photon is measured using an incorrect polarisation basis, then the receiver only stands a 50% chance of correctly measuring the polarisation state. The polarisation splitter 615 then directs the photon to either first single photon detector or second single photon detector 619 dependent on the measured polarisation.

If A has used the wrong measurement basis, then it cannot accurately know the polarisation state of the photons. Therefore, A contacts the source to tell the source which measurement basis A used. B also contacts the source to tell the source which measurement basis B used. The source then communicates to both receiver A and receiver B to tell both receivers which results to keep. Only photons which were measured using both the correct measurement basis by receiver A and receiver B should be retained.

The above quantum communication system is very secure because the source randomly outputs the polarisation stat without the need for further external random number generators. This makes the source very difficult to hack or influence. Further, the source itself does not know the polarisation state outputted to either receiver A or receiver B. Theoretically, a person running the source can accurately measure this polarisation state since it knows the actual polarisation basis. However, this requires further experimental apparatus to be added to the source, the presence of which could be easily monitored. In addition, if a B92 protocol is used, then the source retains no information about the polarisation state or basis in which the photons were sent. Although here again, additional optical components can in principle be used to determine the polarisation of the photons before they are coupled into the fibres.

Figure 30:
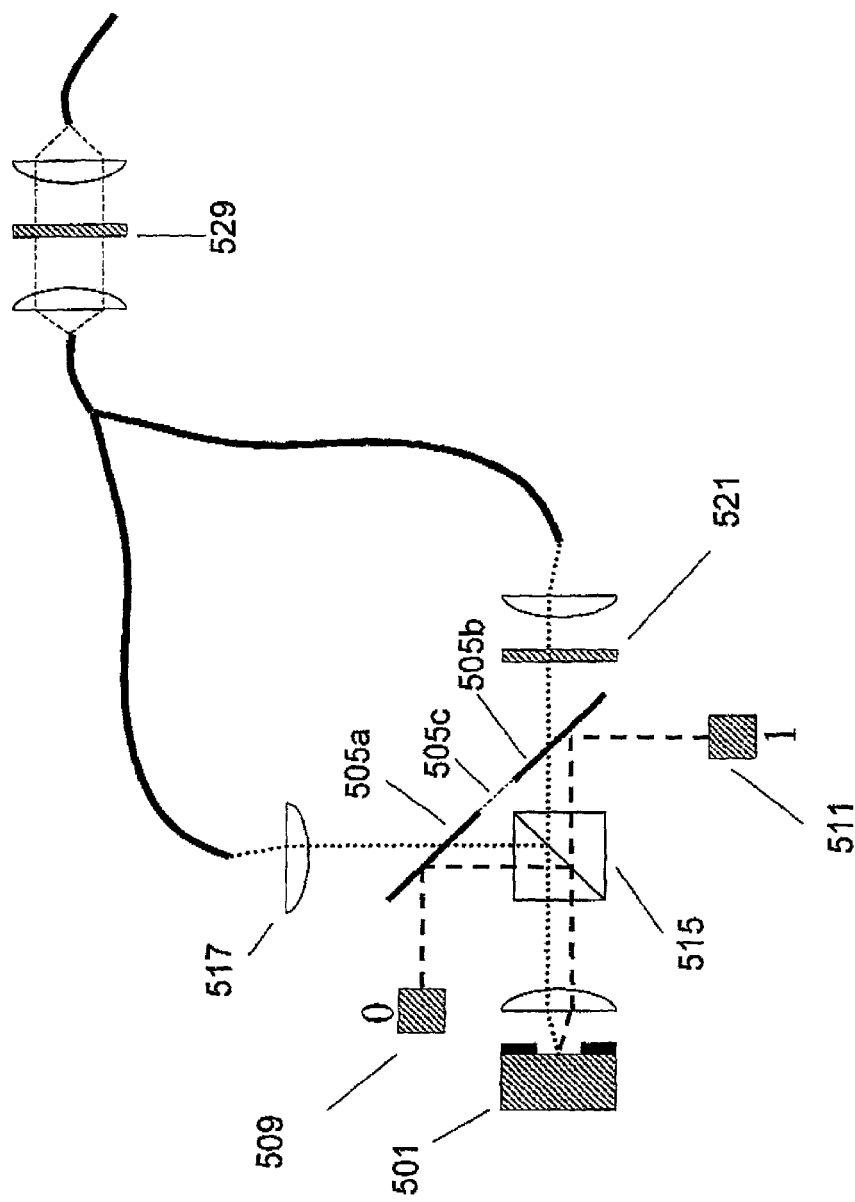
FIG. 30 illustrates a further variation on the photon source of FIG. 25.

The system depicted of FIG. 30 performs the same function as that of FIG. 25. In this example, all emission passes through the polarising beam splitter 515, and the photon to be measured in each of the two paths is subsequently directed towards the single photon detectors 509 and 511, using a dichroic mirrors 505a and 505b. Although the principle of operation is almost identical to that of FIG. 25, a single polarising beam splitter 515 is used rather tan two, and two dichroic mirrors 505a, 505b are used instead of one. (Although, one could realise a situation where dichroic mirrors 505a and 505b are replaced by a single continuous minor bridging gap 505c). The fact that the polarisation of both photons is selected by the same polarising beam splitter means that the alignment of the two polarisation bases for each photon is identical. This could be an advantage over the system of FIG. 25, where the two polarising beam splitters must be independently aligned.

The invention claimed is:

1. A photon source comprising:
    a quantum dot comprising a confined conduction band energy level capable of being populated with at least one carrier and a confined valence band energy level capable of being populated by at least one carrier;
    supply means for intermittently supplying carriers to the energy levels to create a bi-exciton or higher order exciton in the quantum dot, wherein the supply means are configured to regulate the supply of carriers such that as the exciton decays, a plurality of single photons each having different distinct energies are emitted during a predetermined time interval; and separating means for separating the photons having different distinct energies.

2. The photon source of claim 1, further comprising:
fixing means configured to fix a number of excess carriers in the energy levels by fixing the relative position of the energy levels with respect to the Fermi level of a source.

3. The photon source of claim 1, wherein the fixing means is configured to cause at least one excess carrier to populate the energy levels.

4. The photon source of claim 1, wherein the fixing means comprise at least one electrode configured to apply an electric field across the quantum dot.

5. The photon source of claim 1, wherein the supply means are configured to enhance creation of bi-excitons and/or higher order excitons.

6. The photon source of claim 1, further comprising a blocking means to block undesirable photons from certain predetermined transitions.

7. The photon source of claim 1, wherein the separating means is configured to use the difference in energies between the photon emissions to separate the photons.

8. The photon source of claim 7, wherein the separating means is a dichroic mirror.

9. The photon source of claim 1, wherein the separating means comprises means to separate the photons according to their emission time.

10. The photon source of claim 1, further comprising means to measure the polarisation state of one of the emitted photons having a polarisation state related to that of one of the other photons.

11. The photon source of claim 1, wherein the photons emitted due to exciton decay have a first polarisation state or a second polarisation state, the first polarisation state being orthogonal to the second polarisation state, the photon source further comprising encoding means to vary at least one of the quantum states of the photons having the first polarisation state and/or the photons having the second polarisation state.

12. The photon source of claim 11, wherein the encoding means comprises means to rotate the polarisation of the photons by either n° or m°, where n and m are not equal.

13. The photon source of claim 12, wherein the encoding means comprises first rotating means to rotate the polarisation of the photons having the first polarisation state by n° and photons having the second polarisation state by m°, where n and m are not equal and have a difference which is not an integer multiple of 90°.

14. The photon source of claim 13, wherein the encoding means further comprises second means to further rotate the polarisation of both the photons which have passed through the first polarisation means, randomly by r° or t°, where the difference between r and t is an odd integer multiple of 90.

15. The photon source of claim 11, the encoding means further comprising means to set a first phase state of the photons which have the first polarisation and a second phase state of the photons which have a second polarisation, the first and second phase states being non orthogonal.

16. The photon source of claim 11, wherein the encoding means are provided before the separating means.

17. The photon source of claim 11, wherein the encoding means is configured to make the same changes to all photons with related polarisation states arising from decay of the same biexciton or higher order exciton.

18. The photon source of claim 11, wherein the separating means directs photons having at least one of said different distinct energies to said encoding means.

19. The photon source of claim 11, wherein the separating means directs photons having at least one of said different distinct energies to a means for measuring its polarisation state.

20. The photon source of claim 1, further comprising:
blocking means configured to block photons arising from a neutral single exciton emission.

21. The photon source of claim 20, wherein the blocking means comprises filter means to block photons at the neutral single exciton energy.

22. The photon source of claim 20, wherein the blocking means comprises means to block the emission of photons at the time when the emission due to a single neutral exciton is expected.

23. The photon source of claim 1, wherein the supply means comprises incident radiation configured to excite a predetermined number of carriers into the energy levels.

24. The photon source of claim 23, wherein the supply means comprises pulsed radiation.

25. The photon source of claim 1, wherein the supply means comprises modulation means configured to repetitively modulate the transition energy of the quantum dot between an energy which allows carriers to be excited by incident radiation and an energy which blocks the absorption of the incident radiation.

26. The photon source of claim 1, wherein the supply means is configured to electrically inject carriers into the quantum dot.

27. The photon source of claim 1, wherein the source comprises a mirror cavity having a mirror located on opposing sides of said quantum dot.

28. The photon source of claim 27, wherein the spectral band-pass of the cavity is substantially equal to the spectral width of the radiation emitted from the dot in the absence of a cavity.

29. The photon source of claim 27, wherein the blocking means comprises the said cavity.

30. A method of operating a photon source, the photon source comprising:
a quantum dot comprising a confined conduction band energy level capable of being populated with at least one carrier and a confined valence band energy level capable of being populated by at least one carrier,
the method comprising:
intermittently supplying carriers to the energy levels to create a bi-exciton or higher order exciton in the quantum dot;
regulating the supply of carriers such that as the exciton decays, a plurality of single photons each having different distinct energies are emitted during a predetermined time interval; and
separating the photons having different distinct energies.

31. The method of claim 30, further comprising:
fixing a number of excess carriers in the energy levels by fixing the relative position of the energy levels with respect to the Fermi level of the source.

32. The method of claim 30, further comprising blocking photons arising from the neutral single exciton emission.

33. The method of claim 30, further comprising:
outputting photons in groups of m photons, where m is an integer of at least two, wherein at least one measurable quantum state randomly switches between at least two non-orthogonal basis for each group of m photons, the said at least one quantum state remaining fixed for all photons within the same group;

separating the photons within the same group such that one photon is sent to a first detector and a second photon is sent to a second detector;

receiving information over a classical channel from said first detector concerning the measurement basis used by said first receiver;

receiving information over a classical channel from said second detector concerning the measurement basis used by said second receiver; and informing over a classical link, both the first and second detector which results to retain, the source instructing the detectors to retain results from measurements which both detectors made using the same basis as the sent photon.

* * * * *